US007719445B2

(12) United States Patent
Jung et al.

(10) Patent No.: US 7,719,445 B2
(45) Date of Patent: May 18, 2010

(54) METHOD AND APPARATUS FOR ENCODING/DECODING MULTI-CHANNEL AUDIO SIGNAL

(75) Inventors: Yang-Won Jung, Seoul (KR); Hee Suk Pang, Seoul (KR); Hyen-O Oh, Gyeonggi-do (KR); Dong Soo Kim, Seoul (KR); Jae Hyun Lim, Seoul (KR)

(73) Assignee: LG Electronics Inc., Seoul (KR)

( * ) Notice: Subject to any disclaimer, the term of this patent is extended or adjusted under 35 U.S.C. 154(b) by 18 days.

(21) Appl. No.: 12/088,424

(22) PCT Filed: Sep. 27, 2006

(86) PCT No.: PCT/KR2006/003857

§ 371 (c)(1), (2), (4) Date: Jun. 25, 2008

(87) PCT Pub. No.: WO2007/037621

PCT Pub. Date: Apr. 5, 2007

(65) Prior Publication Data

US 2008/0252510 A1 Oct. 16, 2008

Related U.S. Application Data

(60) Provisional application No. 60/720,495, filed on Sep. 27, 2005, provisional application No. 60/755,777, filed on Jan. 4, 2006, provisional application No. 60/782,521, filed on Mar. 16, 2006.

(30) Foreign Application Priority Data

Jul. 12, 2006 (KR) ..................... 10-2006-0065290
Jul. 12, 2006 (KR) ..................... 10-2006-0065291

(51) Int. Cl.
*H03M 7/00* (2006.01)

(52) U.S. Cl. .......................................... 341/60; 341/50

(58) Field of Classification Search .................. 341/50, 341/51, 60, 56; 700/94, 500, 501; 381/17, 381/18, 19

See application file for complete search history.

(56) References Cited

U.S. PATENT DOCUMENTS 5,682,461 A 10/1997 Silzle et al.

(Continued)

FOREIGN PATENT DOCUMENTS

| | | |
|---|---|---|
| KR | 10-2006-79119 | 7/2006 |
| TW | 577044 | 2/2004 |
| WO | 03/046889 | 6/2003 |
| WO | 03/090208 | 10/2003 |

OTHER PUBLICATIONS

Beack, S., et al., "An Efficient Representation Method for ICLD with Robustness to Spectral Distortion", ETRI Journal, vol. 27, No. 3, Jun. 2005, 4 pages.

(Continued)

*Primary Examiner*—Brian Young
(74) *Attorney, Agent, or Firm*—Fish & Richardson P.C.

(57) ABSTRACT

Methods of encoding and decoding a multi-channel audio signal and apparatuses for encoding and decoding a multi-channel audio signal are provided. The apparatus for decoding a multi-channel audio signal includes an unpacking extracting which extracts a pilot and data regarding a quantized CLD between a pair of channels of the plurality of channels from the bitstream, a differential decoding unit which restores a quantized CLD by adding the extracted pilot to the extracted data, and an inverse quantization unit which inversely quantizes the restored quantized CLD using a quantization table that considers the location properties of the pair of channels. The methods of encoding and decoding a multi-channel audio signal and the apparatuses for encoding and decoding a multi-channel audio signal can enable an efficient encoding/decoding by reducing the number of quantization bits required.

10 Claims, 12 Drawing Sheets

U.S. PATENT DOCUMENTS

| | | | | |
|---|---|---|---|---|
| 7,391,870 | B2 * | 6/2008 | Herre et al. | 381/23 |
| 2002/0111804 | A1 | 8/2002 | Choy et al. | |
| 2005/0058304 | A1 | 3/2005 | Baumgarte et al. | |
| 2005/0177360 | A1 | 8/2005 | Schuijers et al. | |
| 2006/0074693 | A1 | 4/2006 | Yamashita | |
| 2008/0015850 | A1 * | 1/2008 | Chen et al. | 704/223 |

OTHER PUBLICATIONS

Beack, S., et al., "Angle-Based Virtual Source Location Representation for Spatial Audio Coding", ETRI Journal, vol. 28, No. 2, Apr. 2006, 4 pages.

International Search Report based on International Application No. PCT/KR2006/003857 dated Jan. 10, 2007, 3 pages.

International Search Report based on International Application No. PCT/KR2006/003830 dated Jan. 18, 2007, 3 pages.

Extended European Search Report, dated May 28, 2009, corresponding to European Application No. EP 06798940, 7 pages.

Oh, Hyen-O., et al., "Proposed core experiment on pilot-based coding of spatial parameters for MPEG Surround," International Organization for Standardization, ISO/IEC JTC1/SC29/WG11, M12549, XP030041219, Oct. 13, 2005, 18 pages.

Seo, Jeongil, et al., "A New Cue Parameter for Spatial Audio Coding," International Organization for Standardization, ISO/IEC JTC1/SC29/WG11, M11264, XP030040038, Oct. 13, 2004, 12 pages.

Herre, J., et al., "The Reference Model Architecture for MPEG Spatial Audio Coding," Audio Engineering Society Convention Paper, XP009059973, May 28, 2005, 13 pages.

Extended European Search Report, dated May 29, 2009, corresponding to European Application No. EP 06798913, 7 pages.

* cited by examiner

METHOD AND APPARATUS FOR ENCODING/DECODING MULTI-CHANNEL AUDIO SIGNAL

TECHNICAL FIELD

The present invention relates to methods of encoding and decoding a multi-channel audio signal and apparatuses for encoding and decoding a multi-channel audio signal, and more particularly, to methods of encoding and decoding a multi-channel audio signal and apparatuses for encoding and decoding a multi-channel audio signal which can reduce bitrate by efficiently encoding/decoding a plurality of spatial parameters regarding a multi-channel audio signal.

BACKGROUND ART

Recently, various digital audio coding techniques have been developed, and an increasing number of products regarding digital audio coding have been commercialized. Also, various multi-channel audio coding techniques based on psychoacoustic models have been developed and are currently being standardized.

Psychoacoustic models are established based on how humans perceive sounds, for example, based on the facts that a weaker sound becomes inaudible in the presence of a louder sound and that the human ear can nominally hear sounds in the range of 20-20,000 Hz. By using such psychoacoustic models, it is possible to effectively reduce the amount of data by removing unnecessary audio signals during the coding of the data.

Conventionally, a bitstream of a multi-channel audio signal is generated by performing fixed quantization that simply involves the use of a single quantization table on data to be encoded. As a result, the bitrate increases.

DISCLOSURE OF INVENTION

Technical Problem

The present invention provides methods of encoding and decoding a multi-channel audio signal and apparatuses of encoding and decoding a multi-channel audio signal which can efficiently encode/decode a multi-channel audio signal and spatial parameters of the multi-channel audio signal and can thus be applied even to an arbitrarily expanded channel environment.

Technical Solution

According to an aspect of the present invention, there is provided a method of encoding a multi-channel audio signal with a plurality of channels. The method includes determining a channel level difference (CLD) between a pair of channels of the plurality of channels, quantizing the CLD in consideration of the location properties of the pair of channels, determining a first pilot that represents a set of quantized CLDs obtained by the quantizing, and determining a difference between the first pilot and each of the set of quantized CLDs.

According to another aspect of the present invention, there is provided a method of receiving a bitstream and decoding a multi-channel audio signal with a plurality of channels. The method includes extracting a pilot and data regarding a quantized CLD between a pair of channels of the plurality of channels from the bitstream, restoring a quantized CLD by adding the extracted pilot to the extracted data; and inversely quantizing the restored quantized CLD using a quantization table that considers the location properties of the pair of channels.

According to another aspect of the present invention, there is provided an apparatus for encoding a multi-channel audio signal with a plurality of channels. The apparatus includes a spatial parameter extraction unit which determines a CLD between a pair of channels of the plurality of channels, a quantization unit which quantizes the CLD obtained by the spatial parameter extraction unit in consideration of the location properties of the pair of channels, and a differential encoding unit which determines a first pilot that represents a set of quantized CLDs obtained by the quantization unit, and encodes a difference between the first pilot and each of the set of quantized CLDs.

According to another aspect of the present invention, there is provided an apparatus for receiving a bitstream and decoding a multi-channel audio signal with a plurality of channels. The apparatus includes an unpacking extracting which extracts a pilot and data regarding a quantized CLD between a pair of channels of the plurality of channels from the bitstream, a differential decoding unit which restores a quantized CLD by adding the extracted pilot to the extracted data, and an inverse quantization unit which inversely quantizes the restored quantized CLD using a quantization table that considers the location properties of the pair of channels.

According to another aspect of the present invention, there is provided a computer-readable recording medium having recorded thereon a program for executing the method of encoding a multi-channel audio signal.

According to another aspect of the present invention, there is provided a computer-readable recording medium having recorded thereon a program for executing the method of decoding a multi-channel audio signal.

According to another aspect of the present invention, there is provided a bitstream of a multi-channel audio signal. The bitstream includes a data field which comprises data regarding a set of quantized CLDs, a pilot field which comprises information regarding a pilot that represents the set of quantized CLDs, and a table information field which comprises information regarding a quantization table used to produce the set of quantized CLDs, wherein the quantization table considers the location properties of the pair of channels.

Advantageous Effects

The methods of encoding and decoding a multi-channel audio signal and the apparatuses for encoding and decoding a multi-channel audio signal can enable an efficient encoding/decoding by reducing the number of quantization bits required.

BRIEF DESCRIPTION OF THE DRAWINGS

The above and other features and advantages of the present invention will become more apparent by describing in detail exemplary embodiments thereof with reference to the attached drawings in which.

BEST MODE FOR CARRYING OUT THE INVENTION

The present invention will now be described more fully with reference to the accompanying drawings in which exemplary embodiments of the invention are shown.

Figure 1:
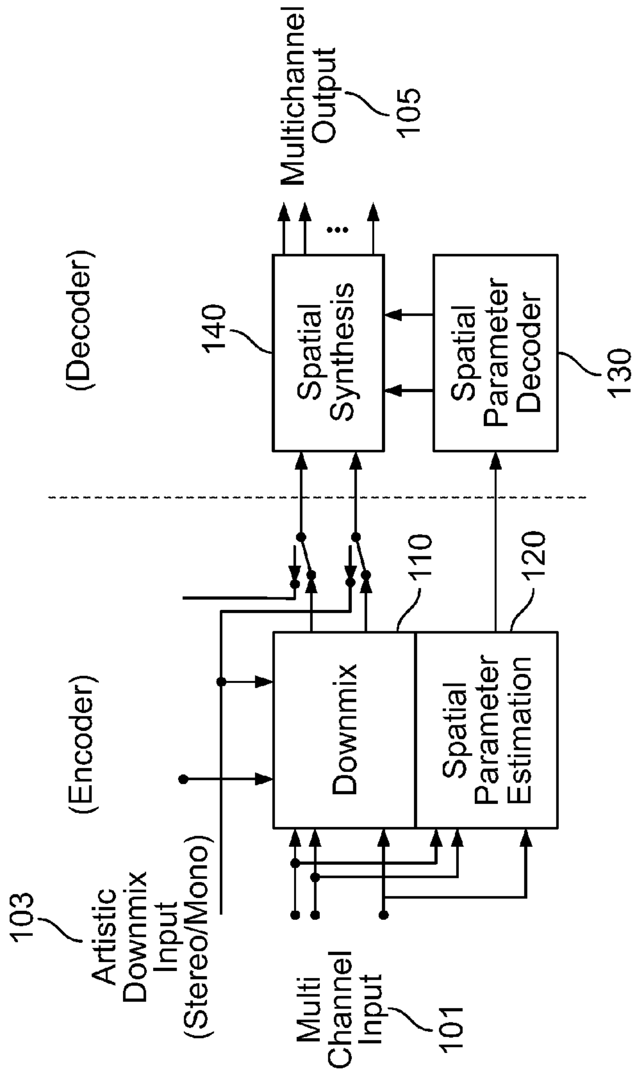
FIG. 1 is a block diagram of a multi-channel audio signal encoder and decoder according to an embodiment of the present invention.

FIG. 1 is a block diagram of a multi-channel audio signal encoder and decoder according to an embodiment of the present invention. Referring to FIG. 1, the multi-channel audio signal encoder includes a down-mixer 110 and a spatial parameter estimator 120, and the multi-channel audio signal decoder includes a spatial parameter decoder 130 and a spatial parameter synthesizer 140. The down-mixer 110 generates a signal that is down-mixed to a stereo or mono channel based on a multi-channel source such as a 5.1 channel source. The spatial parameter estimator 120 obtains spatial parameters that are needed to create multi-channels.

The spatial parameters include a channel level difference (CLD) which indicates the difference between the energy levels of a pair of channels that are selected from among a number of multi-channels, a channel prediction coefficient (CPC) which is a prediction coefficient used to generate three channel signals based on a pair of channel signals, inter-channel correlation (ICC) which indicates the correlation between a pair of channels, and a channel time difference (CTD) which indicates a time difference between a pair of channels.

An artistic down-mix signal 103 that is externally processed may be input to the multi-channel audio signal encoder. The spatial parameter decoder 130 decodes spatial parameters transmitted thereto. The spatial parameter synthesizer 140 decodes an encoded down-mix signal, and synthesizes the decoded down-mix signal and the decoded spatial parameters provided by the spatial parameter decoder 130, thereby generating a multi-channel audio signal 105.

Figure 2:
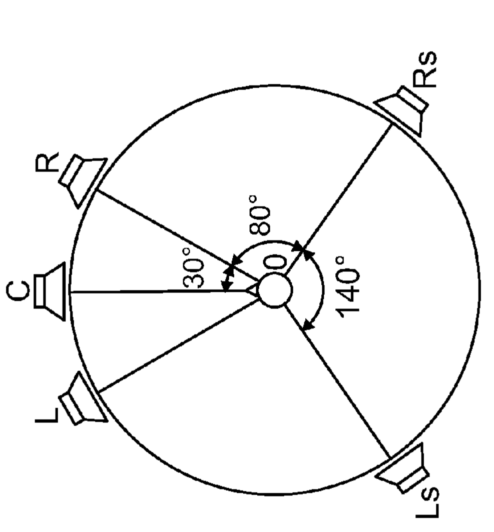
FIG. 2 is a diagram for explaining multi-channel configuration.

FIG. 2 is a diagram for explaining multi-channel configuration according to an embodiment. Specifically, FIG. 2 illustrates 5.1 channel configuration. Since a 0.1 channel is a low-frequency enhancement channel and is without regard to location, it is not illustrated in FIG. 2. Referring to FIG. 2, a left channel L and a right channel R are 30° distant from a center channel C. A left surround channel Ls and a right surround channel Rs are 110° distant from the center channel C and are 80° distant from the left channel L and the right channel R, respectively.

Figure 3:
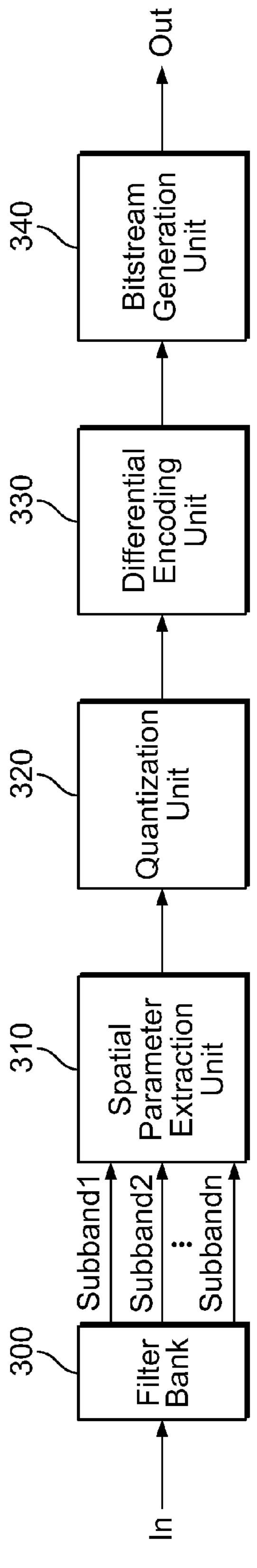
FIG. 3 is a block diagram of an apparatus for encoding spatial parameters of a multi-channel audio signal according to an embodiment of the present invention.

FIG. 3 is a block diagram of an apparatus (hereinafter referred to as the encoding apparatus) for encoding spatial parameters of a multi-channel audio signal according to an embodiment of the present invention. Referring to FIG. 3, the encoding apparatus includes a filter bank 300, a spatial parameter extraction unit 310, a quantization unit 320, a differential encoding unit 330, and a bitstream generation unit 340. When a multi-channel audio signal IN is input, the multi-channel audio signal IN is divided into signals respectively corresponding to a plurality of sub-bands (i.e., sub-bands 1 through N) by the filter bank 300. The filter bank 300 may be a sub-band filter bank or a quadrature mirror filter (QMF) filter bank.

The spatial parameter extraction unit 310 extracts one or more spatial parameters from each of the divided signals. The quantization unit 302 quantizes the extracted spatial parameters. In particular, the quantization unit 302 quantizes a CLD between a pair of channels of a plurality of channels in consideration of the location properties of the pair of channels. In other words, a quantization table used to quantize a CLD between a pair of channels can be created in consideration of the location properties of the pair of channels. For example, a quantization step size or a number of quantization steps (hereinafter referred to as a quantization step quantity) needed to quantize a CLD between a left channel L and a right channel R may be different from a quantization step size or quantization step quantity needed to quantize a CLD between the left channel R and a left surround channel Ls.

The quantization unit 320 performs quantization on a plurality of CLDs, and the differential encoding unit 330 performs differential encoding on a set of quantized CLDs.

In detail, the differential encoding unit 330 determines a pilot P, which is a representative value of a set of quantized CLDs. The pilot P may be the mean, the median, or the mode of the set of quantized CLDs, but the present invention is not restricted thereto. Once the pilot P is determined by the encoding apparatus, the pilot P is transmitted to an apparatus for decoding spatial parameters of a multi-channel audio signal.

Alternatively, the encoding apparatus determines more than one value that can be possibly obtained from the set of quantized CLDs as pilot candidates, performs differential encoding using each of the pilot candidates, and selects one of the pilot candidates that results in the highest encoding efficiency as a pilot for the set of quantized CLDs.

Thereafter, the differential encoding unit 330 calculates a difference d2[n] between the pilot P and each of the set of quantized CLDs. Assuming that the number of quantized CLDs to be differential-encoded is 10, d2[n] can be represented by Equation (1):

$$d2[n]=x[n]-P,\ n=0, 1, \ldots, 9 \qquad \text{MathFigure 1}$$

where x[n] indicates a set of quantized CLDs, P indicates the pilot, and d2[n] indicates a set of differential-encoded results.

An apparatus for decoding spatial parameters of a multi-channel audio signal that receives the differential-encoded results d2[n] and the pilot P can restore a quantized CLD based on the differential-encoded results d2[n] and the pilot P, as indicated by Equation (2):

$$y[n]=d2[n]+P,\ n=0, 1, \ldots, 9 \qquad \text{MathFigure 2}$$

where y[n] indicates a set of quantized CLDs restored from the differential-encoded results d2[n].

The encoding apparatus according to the present embodiment may also include a Huffman encoding unit which performs Huffman encoding on the differential-encoded results d2[n] and the pilot P in order to enhance the efficiency of encoding. Alternatively, the encoding apparatus according to the present embodiment may perform entropy encoding, instead of differential encoding, on the differential-encoded results d 2[n] and the pilot P.

The Huffman encoding unit may perform first Huffman encoding or second Huffman encoding on the differential-encoded results d2[n] or the pilot P.

Figure 4A:
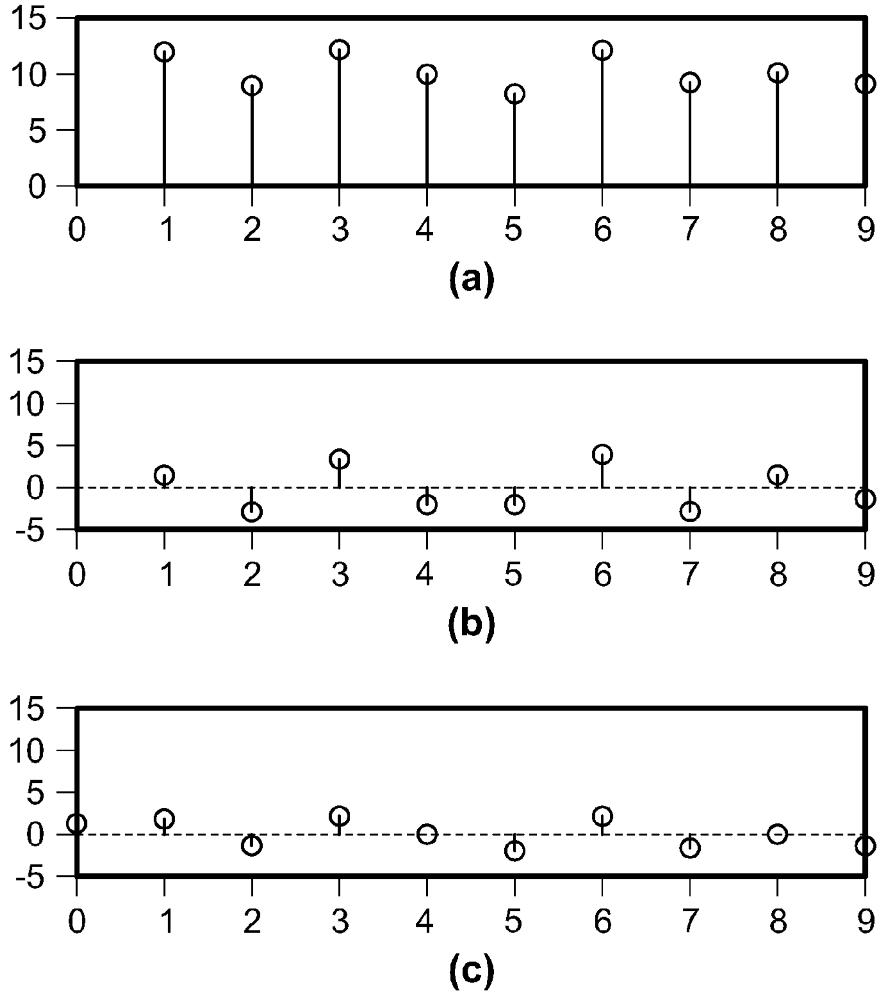
FIG. 4A is a diagram for explaining the performing of differential encoding on quantized spatial parameters using a pilot, according to an embodiment of the present invention.

FIG. 4A is a diagram for explaining the performing of differential encoding on spatial parameters according to an embodiment of the present invention. Specifically, FIG. 4A explains the performing of differential encoding on a set of 10 quantized CLDs using a pilot.

Referring to FIG. 4A(a), a set x[n] of quantized CLDs to be differential-encoded is as follows: x[n]={11, 12, 9, 12, 10, 8, 12, 9, 10, 9}.

Referring to FIG. 4A(b), differential encoding is performed on the set x[n] of quantized CLDs, as indicated by Equation (3):

$$d[0]=x[0],$$

$$d[n]=x[n]-x[n-1],\ \text{for } n=1, 2, \ldots, 9 \qquad \text{MathFigure 3}$$

A set d[n] of differential-encoded results is obtained by performing differential encoding on the quantized CLDs presented in FIG. 4A(a) using Equation (3). The set d [n] of differential-encoded results is as follows: d[n]={11, 1, −3, 3, −2, −2, 4, −3, 1, −1}.

The set d[n] of differential-encoded results can be differential-decoded using Equation (4):

$$y[0]=d[0],$$

$$y[n]=d[n]+y[n-1],\ \text{for } n=1, \ldots, 9 \qquad \text{MathFigure 4}$$

FIG. 4A(c) presents a set d2[n] of differential-encoded results that is obtained by performing differential encoding on the quantized CLDs presented in FIG. 4A(a) using a pilot. The pilot is set to a value of 10, which is the closest integer to the mean of the set x[n] of quantized CLDs. Alternatively, the pilot may be set to a value of 9 or 12, which is the mode of the set x[n] of quantized CLDs.

Referring to FIG. 4A(c), the set d2[n] of differential-encoded results is as follows: d2[n]={1, 2, −1, 2, 0, −2, 2, −1, 0, −1}.

The smaller the variance of data to be transmitted is, the higher the efficiency of transmission of the data to be transmitted becomes. The set d[n] (where n=1~9) of differential-encoded results has a variance of 6.69, whereas the set d2[n] (where n=1~9) of differential-encoded results has a variance of 2.18. Thus, the efficiency of transmission of a bitstream can be enhanced by performing differential encoding using a pilot.

In detail, the total number of bits needed to encode and then transmit the set x[n] of quantized CLDs is 50 (5 bits for each of the set x[n] of quantized CLDs). Referring to the set d[n] of differential-encoded results, the total number of bits needed to encode and then transmit d[0] is 5, and the total number of bits needed to encode and then transmit d[1] through d[9] is 36 (=9×4 bits) because d[1] through d[9] range from −3 to 4. Since the total number of bits needed to encode and then transmit the pilot P (where P=10) is 5 and the total number of bits needed to encode and then transmit d2[0] through d2[9] is 30 (=10×3 bits), the total number of bits needed to encode and then transmit the set d2[n] of differential-encoded results is 35.

However, when there is only a small number of quantized CLDs to be differential-encoded, differential encoding using a pilot may not always be efficient because the transmission of the pilot always requires 5 bits. Therefore, differential encoding using a pilot may be selectively performed according to the number of quantized CLDs to be differential-encoded or another condition. For this, a flag may be inserted into a bitstream to be transmitted indicating whether differential encoding has been performed to produce the bitstream to be transmitted.

Figure 4B:
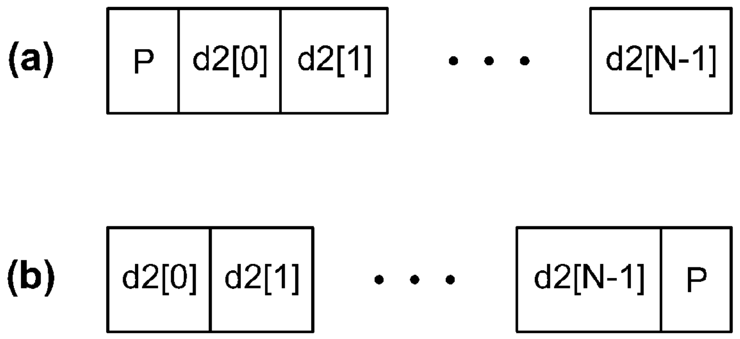
FIG. 4B is a diagram for explaining the generation of a bitstream based on a pilot and differential-encoded spatial parameters, according to an embodiment of the present invention.

FIG. 4B is a diagram for explaining the generation of a bitstream based on a pilot and differential-encoded spatial parameters, according to an embodiment of the present invention. According to the embodiment illustrated in FIG. 4B, not only differential-encoded results but also a pilot must be transmitted.

Referring to FIG. 4B(a), a pilot P may be inserted into a bitstream ahead of a set of differential-encoded results d2[0] through d2[N−1]. Alternatively, referring to FIG. 4B(b), a pilot P may be inserted into a bitstream behind the set of differential-encoded results d2[0] through d2[N−1].

The absolute value of the pilot P is relatively greater than the absolute values of the set d2[n] of differential-encoded results. Therefore, the difference between a previous pilot used for a set of quantized CLDs previously transmitted and a current pilot is determined, and Huffman encoding is performed on the result of the measurement, thereby enhancing the efficiency of encoding.

According to an embodiment, an additional codebook may be provided for the encoding of a pilot. Then, a pilot may be Huffman-encoded with reference to the additional codebook, and the Huffman-encoded pilot is inserted into a bitstream.

The quantization of spatial parameters according to an embodiment of the present invention will hereinafter be described in detail with reference to FIG. 13.

Figure 13:
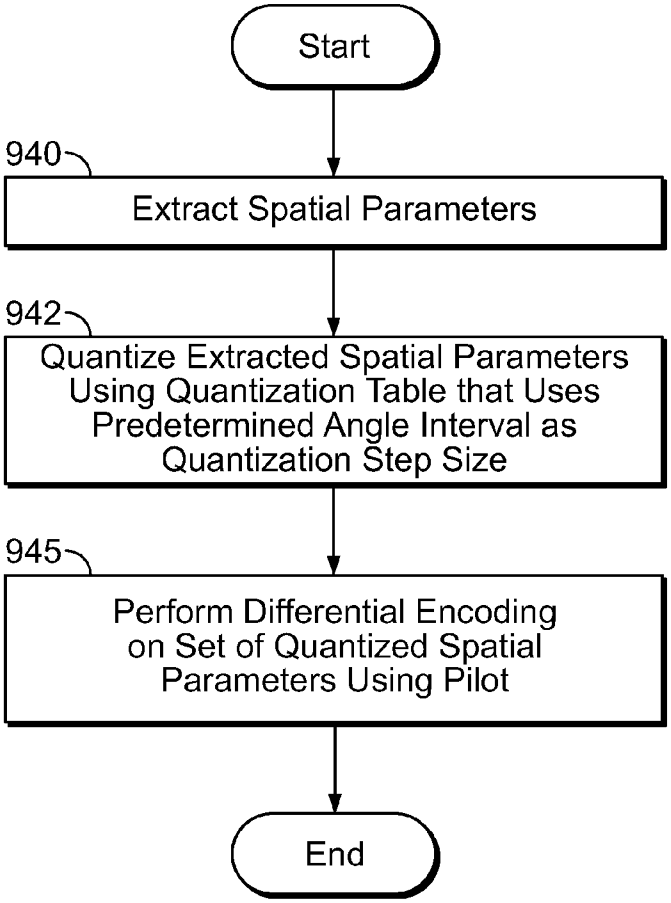
FIG. 13 is a flowchart illustrating a method of encoding spatial parameters of a multi-channel audio signal according to an embodiment of the present invention.

Referring to FIG. 13, in operation 940, the spatial parameter extraction unit 310 extracts one or more spatial parameters from an audio signal to be encoded which is one of a plurality of audio signals that are obtained by dividing a multi-channel audio signal and respectively correspond to a plurality of sub-bands. Examples of the extracted spatial parameters include a CLD, CTD, ICC, and CPC. In operation 942, the quantization unit 320 quantizes the extracted spatial parameters, and particularly, a CLD, using a quantization table that uses a predetermined angle interval as a quantization step size. In operation 945, the differential encoding unit 330 performs differential encoding on a set of quantized CLDs provided by the quantization unit 320 using a pilot. The operation of the differential encoding unit 330 has already been described above with reference to FIGS. 3 through 4B, and thus a detailed description thereof will be skipped.

The quantization unit 320 may output index information corresponding to each of the quantized CLDs to an encoding unit. Each of the quantized CLDs may be defined as the base-10 logarithm of the power ratio between a plurality of multi-channel audio signals, as indicated by Equation (1):

$$CLD_{x_1x_2}^{n,m} = 10\log10\left(\frac{\sum_n\sum_m x_1^{n,m}x_1^{n,m*}}{\sum_n\sum_m x_2^{n,m}x_2^{n,m*}}\right) \quad \text{MathFigure 5}$$

where n indicates a time slot index, and m indicates a hybrid sub-band index.

The bitstream generation unit 340 generates a bitstream using a down-mixed audio signal and the quantized spatial parameters, including the quantized CLDs.

Figure 5:
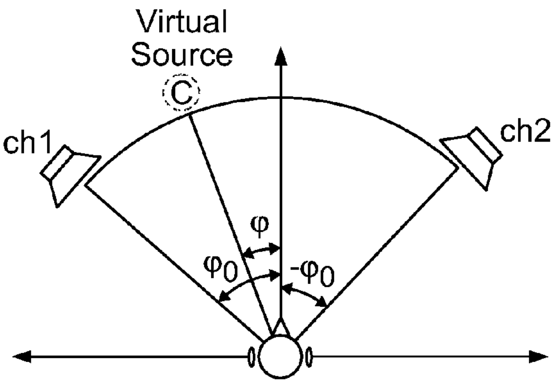
FIG. 5 is a diagram for explaining the determination of the location of a virtual sound source by a quantization unit illustrated in FIG. 3, according to an embodiment of the present invention.

FIG. 5 is a diagram for explaining the determination of the location of a virtual sound source by the quantization unit 320, according to an embodiment of the present invention, and explains an amplitude panning law that is needed to explain a sine/tangent law.

Referring to FIG. 5, when a listener faces forward, a virtual sound source may be located at any arbitrary position (e.g., point C) by adjusting the sizes of a pair of channels ch1 and ch2. In this case, the location of the virtual sound source may be determined according to the sizes of the channels ch1 and ch2, as indicated by Equation (6):

$$\frac{\sin\varphi}{\sin\varphi_0} = \frac{g_1 - g_2}{g_1 + g_2} \quad \text{MathFigure 6}$$

where $$\phi$$

indicates the angle between the virtual sound source and the center between the channels ch1 and ch2, $$\phi_0$$

indicates the angle between the center between the channels ch1 and ch2 and the channel ch1, and $g_i$ indicates a gain factor corresponding to a channel chi.

When the listener faces toward the virtual sound source, Equation (6) can be rearranged into Equation (7):

$$\frac{\tan\varphi}{\tan\varphi_0} = \frac{g_1 - g_2}{g_1 + g_2} \quad \text{MathFigure 7}$$

Based on Equations (5), (6), and (7), a CLD between the channels ch1 and ch2 can be defined by Equation (8):

$$\begin{aligned} CLD_{x_1x_2}^{n,m} &= 10\log10\left(\frac{\sum_n\sum_m x_1^{n,m}x_1^{n,m*}}{\sum_n\sum_m x_2^{n,m}x_2^{n,m*}}\right) \\ &= 10\log10\left(\frac{g_1^{n,m^2}\sum_n\sum_m x^{n,m}x^{n,m*}}{g_2^{n,m^2}\sum_n\sum_m x^{n,m}x^{n,m*}}\right) \\ &= 20\log10\left(\frac{g_1^{n,m}}{g_2^{n,m}}\right). \end{aligned} \quad \text{MathFigure 8}$$

Based on Equations (6) and (8), the CLD between the channels ch1 and ch2 may also be defined using the angle $$\phi$$

of the virtual sound source and the channels ch1 and ch2, as indicated by Equations (9) and (10):

$$CLD_{x_1x_2}^{n,m} = 20\log10(G_{1,2}) \quad \text{MathFigure 9}$$

$$\begin{aligned} G_{1,2} &= \frac{g_1^{n,m}}{g_2^{n,m}} \\ &= \frac{\sin\varphi_0 + \sin\varphi}{\sin\varphi_0 - \sin\varphi}. \end{aligned} \quad \text{MathFigure 10}$$

According to Equations (9) and (10), the CLD may correspond to the angular Position $$\phi$$

of the virtual sound source. In other words, the CLD between the channels ch1 and ch2, i.e., the difference between the energy levels of the channels ch1 and ch2, may be represented by the angular position $$\phi$$

of the virtual sound source that is located between the channels ch1 and ch2.

Figure 6:
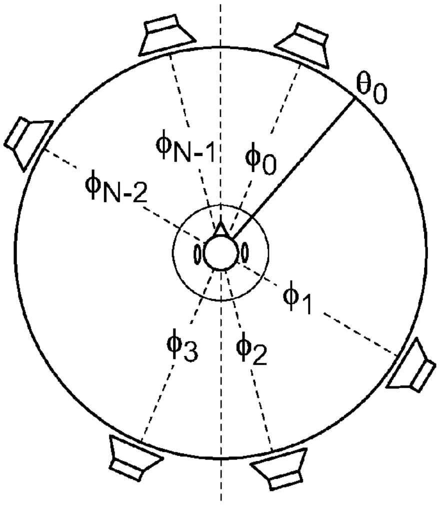
FIG. 6 is a diagram for explaining the determination of the location of a virtual sound source by the quantization unit illustrated in FIG. 3, according to another embodiment of the present invention.

FIG. 6 is a diagram for explaining the determination of the location of a virtual sound source by the quantization unit 320 illustrated in FIG. 3, according to another embodiment of the present invention.

When a plurality of speakers are located as illustrated in FIG. 6, a CLD between an i-th channel and an (i−1)-th channel may be represented based on Equations (4) and (5), as indicated by Equations (11) and (12):

$$CLD = 20\log10(G_i) \quad \text{MathFigure 11}$$

$$G_i = \frac{g_i}{g_{i-1}} = \frac{\sin\frac{\phi_i - \phi_{i-1}}{2} - \sin\left(\theta_i - \frac{\phi_i + \phi_{i-1}}{2}\right)}{\sin\frac{\phi_i - \phi_{i-1}}{2} + \sin\left(\theta_i - \frac{\phi_i + \phi_{i-1}}{2}\right)} \quad \text{MathFigure 12}$$

where $\phi$ indicates the angular position of a virtual sound source that is located between the i-th channel and the (i−1)-th channel, and $\phi$ indicates the angular position of an i-th speaker.

According to Equations (11) and (12), a CLD between a pair of channels can be represented by the angular position of a virtual sound source between the channels for any speaker configuration.

Figure 7:
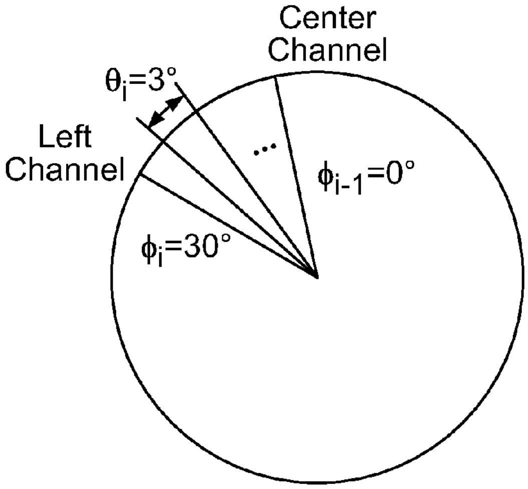
FIG. 7 is a diagram for explaining the division of a space between a pair of channels into a plurality of sections using an angle interval according to an embodiment of the present invention.

FIG. 7 is a diagram for explaining the division of the space between a pair of channels into a plurality of sections using a predetermined angle interval. Specifically, FIG. 7 explains the division of the space between a center channel and a left channel that form an angle of 30° into a plurality of sections.

The spatial information resolution of humans denotes a minimal difference in spatial information regarding an arbitrary sound that can be perceived by humans. According to psychoacoustic research, the spatial information resolution of humans is about 3° Accordingly, a quantization step size that is required to quantize a CLD between a pair of channels may be set to an angle interval of 3° Therefore, the space between the center channel and the left channel may be divided into a plurality of sections, each section having an angle of 3°

Referring to FIG. 7

$\phi_i$–

–

$\phi_{i-1}$

=30° A CLD between the center channel and the left channel may be calculated by Increasing $\theta_i$ 3° at a time, from 0° to 30° The results of the calculation are presented in Table 1.

TABLE 1

| | Angle | | | | | |
|---|---|---|---|---|---|---|
| | 0 | 3 | 6 | 9 | 12 | 15 |
| CLD | ∞ | 44.3149 | 28.00306 | 17.13044 | 8.201453 | 0 |
| | Angle | | | | | |
| | 18 | 21 | 24 | 27 | 30 | |
| CLD | −8.20145 | −17.1304 | −28.0031 | −44.3149 | −∞ | |

The CLD between the center channel and the left channel can be quantized by using Table 1 as a quantization table. In this case, a quantization step quantity that is required to quantize the CLD between the center channel and the left channel is 11.

Figure 8:
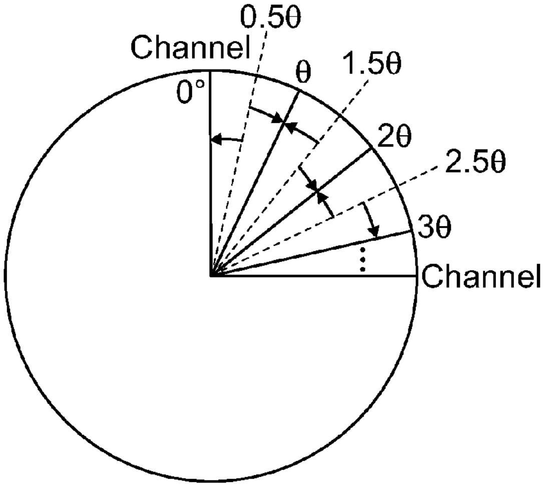
FIG. 8 is a diagram for explaining the quantization of a channel level difference (CLD) by the quantization unit illustrated in FIG. 3 according to an embodiment of the present invention.

FIG. 8 is a diagram for explaining the quantization of a CLD using a quantization table by the quantization unit 320 illustrated in FIG. 3, according to an embodiment of the present invention. Referring to FIG. 8, the mean of a pair of adjacent angles in a quantization table may be set as a quantization threshold.

Assume that the angle between a center channel and a right channel is 30° and that a CLD between the center channel and the right channel is quantized by dividing the space between the center channel and the right channel into a plurality of sections, each section having an angle of 3°

The by the spatial parameter extraction unit 310 is converted into a virtual sound source angular position using Equations (11) and (12). If the virtual sound source angular position is between 1.5° and 4.5° the extracted CLD may be quantized to a value stored in Table 1 in connection with an angle of 3°

If the virtual sound source angular position is between 4.5 and 7.5, the extracted CLD may be quantized to a value stored in Table 1 in connection with an angle of 6°

A quantized CLD obtained in the aforementioned manner may be represented by index information. For this, a quantization table comprising index information, i.e., Table 2, may be created based on Table 1.

TABLE 2

| | Index | | | | | |
|---|---|---|---|---|---|---|
| | 0 | 1 | 2 | 3 | 4 | 5 |
| CLD | 150 | 44 | 28 | 17 | 8 | 0 |
| | Index | | | | | |
| | 6 | 7 | 8 | 9 | 10 | |
| CLD | −8 | −17 | −28 | −44 | −150 | |

Table 2 presents only the integer parts of the CLD values presented in Table 1, and replaces CLD values of 8 and −8 in Table 1 with CLD values of 150 and −150, respectively.

Since Table 2 comprises pairs of CLD values having the same absolute values but different signs, Table 2 can be simplified into Table 3.

TABLE 3

| | Index | | | | | |
|---|---|---|---|---|---|---|
| | 0 | 1 | 2 | 3 | 4 | 5 |
| CLD | 150 | 44 | 28 | 17 | 8 | 0 |

In the case of quantizing a CLD among three or more channels, different quantization tables can be used for different pairs of. In other words, a plurality of quantization tables can be respectively used for a plurality of pairs of channels having different locations. A quantization table suitable for each of the different pairs of channels can be created in the aforementioned manner.

Table 4 is a quantization table that is needed to quantize a CLD between a left channel and a right channel that form an angle of 60° Table 4 has a quantization step size of 3°

TABLE 4

| | Index | | | | | |
|---|---|---|---|---|---|---|
| | 0 | 1 | 2 | 3 | 4 | 5 |
| CLD | 0 | 4 | 7 | 11 | 15 | 20 |
| | Index | | | | | |
| | 6 | 7 | 8 | 9 | 10 | |
| CLD | 25 | 32 | 41 | 55 | 150 | |

Table 5 is a quantization table that is needed to quantize a CLD between a left channel and a left surround channel that form an angle of 80° Table 5 has a quantization step size of 3°

TABLE 5

| | Index | | | | | |
|---|---|---|---|---|---|---|
| | 0 | 1 | 2 | 3 | 4 | 5 |
| CLD | 0 | 3 | 5 | 8 | 10 | 13 |
| | Index | | | | | |
| | 6 | 7 | 8 | 9 | 10 | 11 |
| CLD | 16 | 20 | 24 | 28 | 34 | 41 |
| | Index | | | | | |
| | 12 | 13 | | | | |
| CLD | 53 | 150 | | | | |

Table 5 can be used not only for left and left surround channels that form an angle of 80° but also for right and right surround channels that form an angle of 80°

Table 6 is a quantization table that is needed to quantize a CLD between a left surround channel and a right surround channel that form an angle of 80° Table 6 has a quantization step size of 3°

TABLE 6

| | Index | | | | | |
|---|---|---|---|---|---|---|
| | 0 | 1 | 2 | 3 | 4 | 5 |
| CLD | 0 | 1 | 2 | 2 | 3 | 4 |
| | Index | | | | | |
| | 6 | 7 | 8 | 9 | 10 | 11 |
| CLD | 5 | 6 | 7 | 8 | 9 | 10 |
| | Index | | | | | |
| | 12 | 13 | 14 | 15 | 16 | 17 |
| CLD | 11 | 12 | 14 | 15 | 17 | 19 |
| | Index | | | | | |
| | 18 | 19 | 20 | 21 | 22 | 23 |
| CLD | 22 | 25 | 30 | 36 | 46 | 150 |

In the method of encoding spatial parameters of a multi-channel audio signal according to the present embodiment, a CLD between a pair of channels is quantized linearly to the angular position of a virtual sound source between the channels, instead of being quantized linearly to a predefined value. Therefore, it is possible to enable a highly efficient and suitable quantization for use in psychoacoustic models.

The method of encoding spatial parameters of a multi-channel audio signal according to the present embodiment can be applied not only to a CLD but also to spatial parameters other than a CLD such as ICC and a CPC.

According to the present embodiment, if an apparatus (hereinafter referred to as the decoding apparatus) for decoding spatial parameters of a multi-channel audio signal does not have a quantization table that is used by the quantization unit 320 to perform CLD quantization, then the bitstream generation unit 340 may insert information regarding the quantization table into a bitstream and transmit the bitstream to the decoding apparatus, and this will hereinafter be described in further detail.

According to an embodiment of the present invention, information regarding a quantization table used in the encoding apparatus illustrated in FIG. 3 may be transmitted to the decoding apparatus by inserting into a bitstream all the values present in the quantization table, including indexes and CLD values respectively corresponding to the indexes, and transmitting the bitstream to the decoding apparatus.

According to another embodiment of the present invention, the information regarding the quantization table used in the encoding apparatus may be transmitted to the decoding apparatus by transmitting information that is needed by the decoding apparatus to restore the quantization table used by the encoding apparatus. For example, minimum and maximum angles, and a quantization step quantity used in the quantization table used in the encoding apparatus may be inserted into a bitstream, and then, the bitstream may be transmitted to the decoding apparatus. Then, the decoding apparatus can restore the quantization table used by the encoding apparatus based on the information transmitted by the encoding apparatus and Equations (7) and (8).

The quantization of spatial parameters according to another embodiment of the present invention will hereinafter be described in detail with reference to FIG. 14. According to the present embodiment, spatial parameters regarding a multi-channel audio signal can be quantized using two or more quantization tables having different quantization resolutions.

Figure 14:
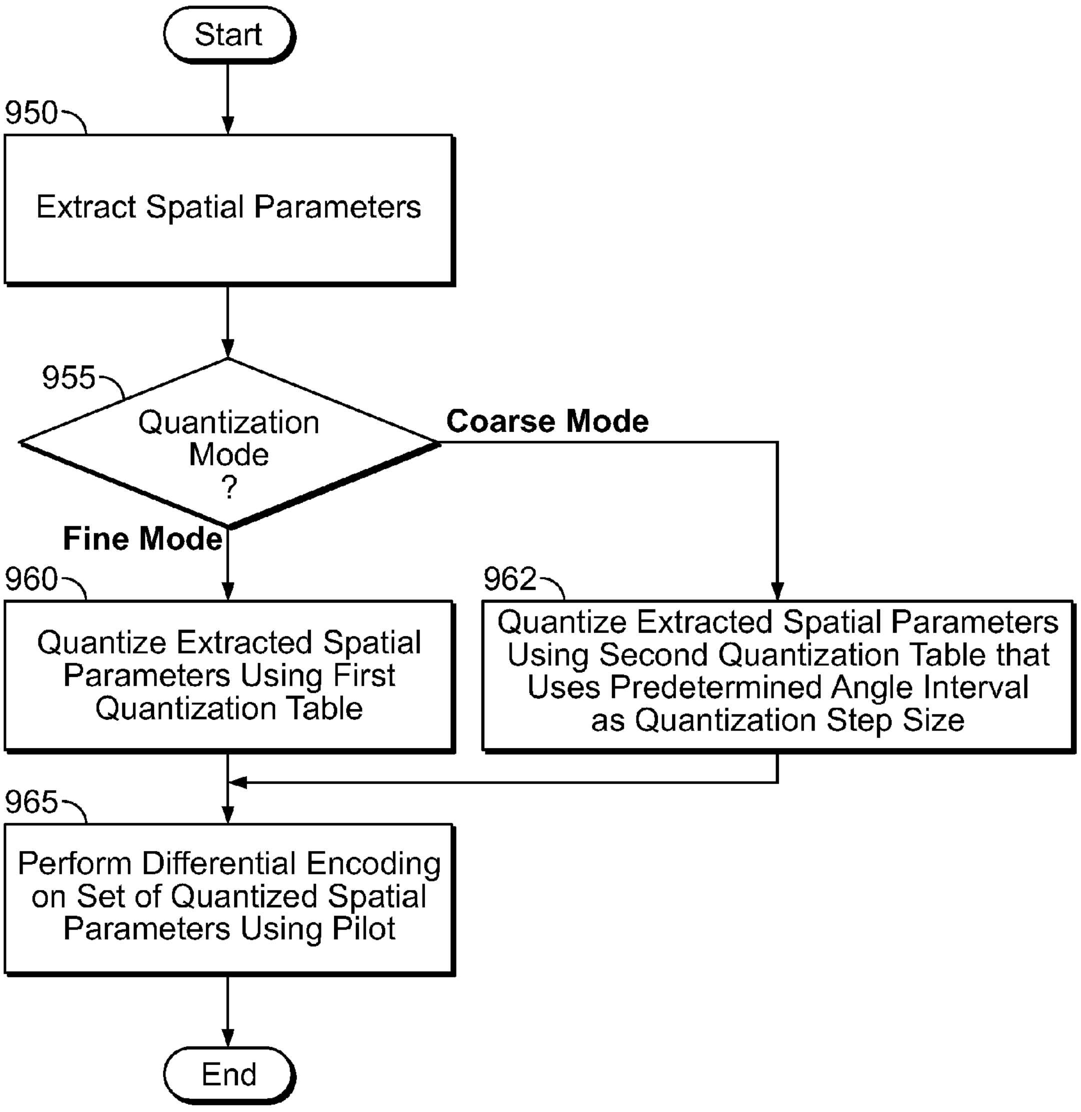
FIG. 14 is a flowchart illustrating a method of encoding spatial parameters of a multi-channel audio signal according to another embodiment of the present invention.

Referring to FIG. 14, in operation 950, the spatial information extraction unit 402 extracts one or more spatial parameters from an audio signal to be encoded which is one of a plurality of audio signals that are obtained by dividing a multi-channel audio signal and respectively correspond to a plurality of sub-bands. Examples of the extracted spatial parameters include a CLD, CTD, ICC, and CPC.

In operation 955, the quantization unit 320 determines one of a fine mode having a full quantization resolution and a coarse mode having a lower quantization resolution than the fine mode as a quantization mode as a quantization mode for the audio signal to be encoded. The fine mode corresponds to a greater quantization step quantity and a smaller quantization step size than the coarse mode.

The quantization unit 320 may determine one of the fine mode and the coarse mode as the quantization mode for the audio signal to be encoded according to the energy level of the audio signal to be encoded. According to psychoacoustic models, it is more efficient to sophisticatedly quantize an audio signal with a high energy level than to sophisticatedly quantize an audio signal with a low energy level. Thus, the quantization unit 320 may quantize the multi-channel audio signal in the fine mode if the energy level of the audio signal to be encoded is higher than a predefined reference value, and quantize the audio signal to be encoded in the coarse mode otherwise.

For example, the quantization unit 320 may compare the energy level of a signal handled by an R-OTT module with the energy level of the audio signal to be encoded. Then, if the energy level of the signal handled by an R-OTT module is lower than the energy level of the audio signal to be encoded, then the quantization unit 320 may perform quantization in the coarse mode. On the other hand, if the energy level of the signal handled by the R-OTT module is higher than the energy level of the audio signal to be encoded, then the quantization unit 320 may perform quantization in the fine mode.

If the R-OTT module has a 5-1-5-1 configuration, the quantization unit 320 may compare the energy levels of audio signals respectively input via left and right channels with the energy level of the audio signal to be encoded in order to determine a CLD quantization mode for an audio signal input to R-OTT3.

In operation 960, if the fine mode is determined in operation 955 as the quantization mode for the audio signal to be encoded, then the quantization unit 320 quantizes a CLD using a first quantization table having a full quantization resolution. The first quantization table comprises 31 quantization steps, and quantizes a CLD between a pair of channels by dividing the space between the pair of channels into 31 sections. In the fine mode, In the fine mode, quantization tables applied to each pair of channels have the same number of quantization steps.

In operation 962, if the coarse mode is determined in operation 955 as the quantization mode for the audio signal to be encoded, then the quantization unit 320 quantizes a CLD using a second quantization table having a lower quantization resolution than the first quantization table. The second quantization table has a pre-determined angle interval as a quantization step size. The creation of the second quantization table and the quantization of a CLD using the second quantization table may be the same as described above with reference to FIGS. 7 and 8.

In operation 965, the differential encoding unit 330 performs differential encoding, using a pilot, on a set of quantized CLDs obtained by the quantization unit 320. The operation of the differential encoding unit 330 has already been described above with reference to FIGS. 3 through 4B, and thus, a detailed description thereof will be skipped.

The quantization of spatial parameters according to another embodiment of the present invention will hereinafter be described in detail with reference to FIG. 15.

Figure 15:
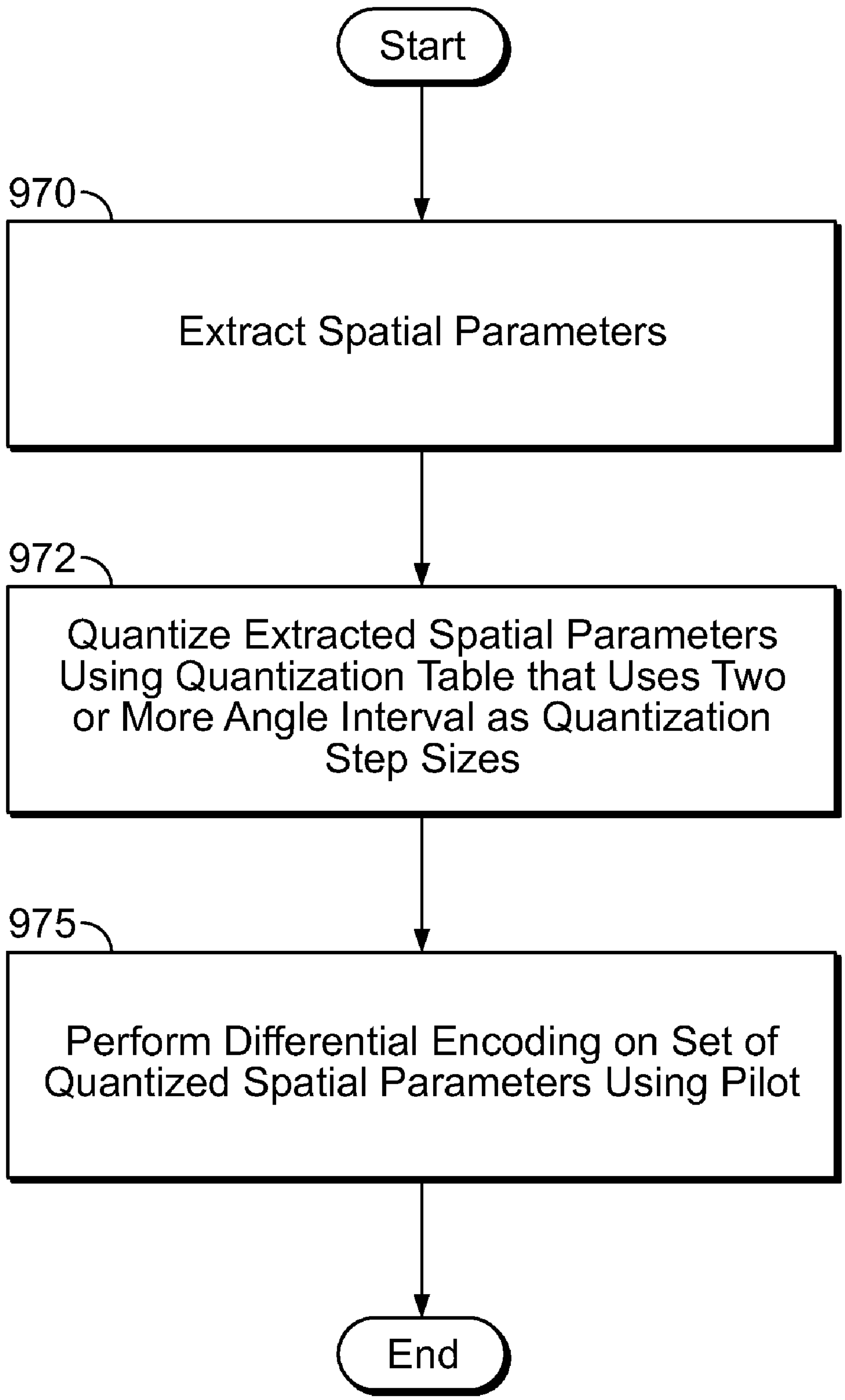
FIG. 15 is a flowchart illustrating a method of encoding spatial parameters of a multi-channel audio signal according to another embodiment of the present invention.

Referring to FIG. 15, in operation 970, the spatial parameter extraction unit 402 extracts one or more spatial parameters from an audio signal to be encoded which is one of a plurality of audio signals that are obtained by dividing a multi-channel audio signal and respectively correspond to a plurality of sub-bands. Examples of the extracted spatial parameters include a CLD, CTD, ICC, and CPD. In operation 972, the quantization unit 320 quantizes the extracted spatial parameters, and particularly, a CLD, using a quantization table that uses two or more angles as quantization step sizes. In this case, the quantization unit 320 may transmit index information corresponding to a CLD value obtained by the quantization performed in operation 975 to an encoding unit. In operation 975, the differential encoding unit 330 performs differential encoding, using a pilot, on a set of quantized CLDs obtained by the quantization unit 320. The operation of the differential encoding unit 330 has already been described above with reference to FIGS. 3 through 4B, and thus, a detailed description thereof will be skipped.

Figure 9:
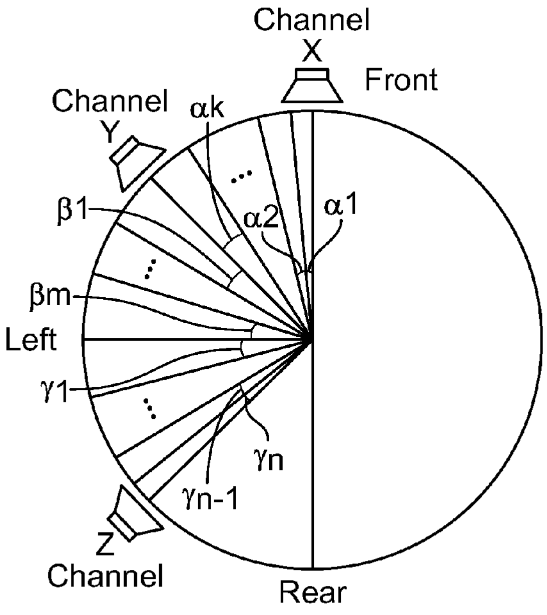
FIG. 9 is a diagram for explaining the division of a space between a pair of channels into a number of sections having different angles, according to an embodiment of the present invention.

FIG. 9 is a diagram for explaining the division of a space between a pair of channels into a number of sections using two or more angle intervals for performing a CLD quantization operation with a variable angle interval according to the locations of the pair of channels.

According to psychoacoustic research, the spatial information resolution of humans varies according to the location of a sound source. When the sound source is located at the front, the spatial information resolution of humans may be 3.6° When the sound source is located on the left, the spatial information resolution of humans may be 9.2° When the sound source is located at the rear, the spatial information resolution of humans may be 5.5°

Given all this, a quantization step size may be set to an angle interval of about 3.6° for channels located at the front, an angle interval of about 9.2° for channels located on the left or right, and an angle interval of about 5.5° for channels located at the rear.

For a smooth transition from the front to the left or from the left to the rear, quantization step sizes may be set to irregular angle intervals. In other words, an angle interval gradually increases in a direction from the front to the left so that a quantization step size increases. On the other hand, the angle interval gradually decreases in a direction from the left to the rear so that the quantization step size decreases.

Referring to a plurality of channels illustrated in FIG. 9, channel X is located at the front, channel Y is located on the left, and channel Z is located at the rear. In order to determine a CLD between channel X and channel Y, the space between channel X and channel Y is divided into k sections respectively having angles $\alpha_1$ through $\alpha_k$.

The relationship between angles $\alpha_1$ through $\alpha_k$ may be represented by Equation (13):

$$\alpha_1 \leqq \alpha_2 \leqq \ldots \leqq \alpha_k \qquad \text{MathFigure 13}$$

In order to determine a CLD between channel Y and channel Z, the space between channel Y and channel Z may be divided into m sections respectively having angles $\beta_1$ through $\beta_m$ and n sections respectively having $y_1$ through $y_n$. An angle interval gradually increases in a direction from channel Y to the left, and gradually decreases in a direction from the left to channel Z. The relationships between the angles $\beta_1$ through $\beta_m$ and between the angles $y_1$ through $y_n$ may be respectively represented by Equations (14) and (15):

$$\beta_1 \leqq \beta_2 \leqq \ldots \leqq \beta_m \qquad \text{MathFigure 14}$$

$$\gamma_1 \geqq \gamma_2 \geqq \ldots \geqq \gamma_n \qquad \text{MathFigure 15}$$

The angles $\alpha_k$, $\beta_m$, and $\gamma_n$ are exemplary angles for explaining the division of the space between a pair of channels using two or more angle intervals, wherein the number of angle intervals used to divide the space between a pair of channels may be 4 or greater according to the number and locations of multi-channels.

Also, the angles $\alpha_k$, $\beta_m$, and $\gamma_n$ may be uniform or variable. If the angles $\alpha_k$, $\beta_m$, and $\gamma_n$ are uniform, they may be represented by Equation (16):

$$\alpha_k \leqq \gamma_n \leqq \beta_m \text{ (except for when } \alpha_k=\gamma_n=\beta_m) \qquad \text{MathFigure 16}$$

Equation (16) indicates an angle interval characteristic according to the spatial information resolution of humans. For example, $\alpha_k=$ 3.6°

$\beta_m=$ 9.2° and $\gamma_n=$ 5.5°

Table 7 presents the correspondence between a plurality of CLD values and a plurality of angles respectively corresponding to a plurality of adjacent sections that are obtained by dividing the space between a center channel and a left channel that form an angle of 30° using two or more angle intervals.

TABLE 7

| | Angle | | | | | |
|---|---|---|---|---|---|---|
| | 0 | 1 | 3 | 5 | 8 | 11 |
| CLD | CLD(0) | CLD(1) | CLD(3) | CLD(5) | CLD(8) | CLD(11) |

| | Angle | | | | |
|---|---|---|---|---|---|
| | 14 | 18 | 22 | 26 | 30 |
| CLD | CLD(14) | CLD(18) | CLD(22) | CLD(26) | CLD(30) |

Referring to Table 7, Angle indicates the angle between a virtual sound source and the center channel, and CLD(X) indicates a CLD value corresponding to an angle X. The CLD value CLD(X) can be calculated using Equations (7) and (8).

By using Table 7 as a quantization table, a CLD between the center channel and the left channel can be quantized. In this case, a quantization step quantity needed to quantize the CLD between the center channel and the left channel is 11.

Referring to Table 7, as an angle interval increases in the direction from the front to the left, a quantization step size increases accordingly, and this indicates that the spatial information resolution of humans increases in the direction from the front to the left.

The CLD values presented in Table 7 may be represented by respective corresponding indexes. For this, Table 8 can be created based on Table 7.

TABLE 8

| | Angle | | | | | |
|---|---|---|---|---|---|---|
| | 0 | 1 | 2 | 3 | 4 | 5 |
| CLD | CLD(0) | CLD(1) | CLD(3) | CLD(5) | CLD(8) | CLD(11) |

| | Angle | | | | |
|---|---|---|---|---|---|
| | 6 | 7 | 8 | 9 | 10 |
| CLD | CLD(14) | CLD(18) | CLD(22) | CLD(26) | CLD(30) |

Figure 10:
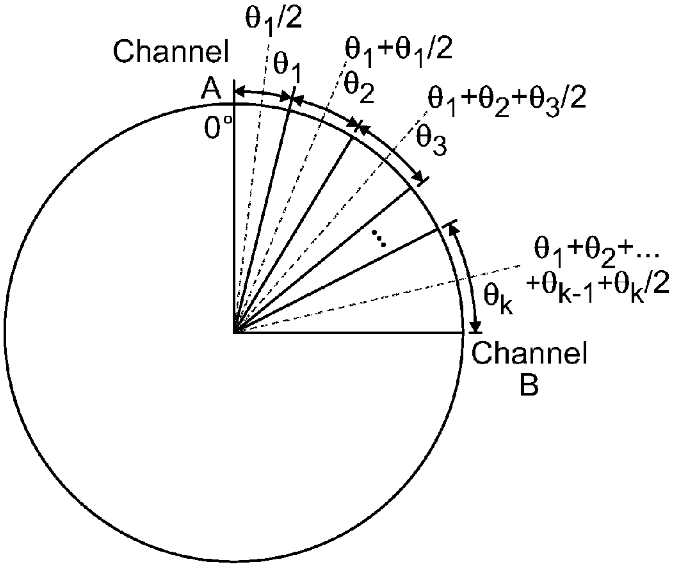
FIG. 10 is a diagram for explaining the quantization of a CLD by the quantization unit illustrated in FIG. 3 according to another embodiment of the present invention.

FIG. 10 is a diagram for explaining the quantization of a CLD using a quantization table by the quantization unit 320 illustrated in FIG. 3, according to another embodiment of the present invention. Referring to FIG. 10, the mean of a pair of adjacent angle presented in a quantization table may be set as a quantization threshold.

In detail, in the case of quantizing a CLD between channel A, which is located at the front, and channel B, which is located on the right, the space between channel A and channel B may be divided into k sections respectively corresponding to k angles $\theta_1$, $\theta_2, \ldots$ $\theta_k$.

The angles $\theta_1$, $\theta_2, \ldots$ $\theta_k$ can be represented by Equation (17):

$$\theta_1 \leqq \theta_2 \leqq \ldots \leqq \theta_k \qquad \text{MathFigure 17}$$

Equation (17) indicates an angle interval characteristic according to the locations of channels. According to Equation (17), the spatial information resolution of humans increases in the direction from the front to the left.

The quantization unit 320 converts a CLD extracted by the spatial parameter extraction unit 402 into a virtual sound source angular position using Equations (7) and (8).

As indicated by Equation (10), if the virtual sound source angle is between $\frac{\theta_1}{2}$ and $\theta_1$

+

-continued $\frac{\theta_2}{2}$ then the extracted CLD may be quantized to a value corresponding to the angle
$\theta_1$
On the other hand, if the virtual sound source angle is between
$\theta_1$
+

$\frac{\theta_2}{2}$ and
$\theta_1$
+
$\theta_2$
+

$\frac{\theta_3}{2}$ then the extracted CLD may be quantized to a value corresponding to the sum of the angles$_1$ and $_2$.

In the case of quantizing CLDs for three or more channels, different quantization tables can be used for different pairs of channels. In other words, a plurality of quantization tables can be respectively used for a plurality of pairs of channels having different locations. A quantization table for each of the different pairs of channels can be created in the aforementioned manner.

According to the present embodiment, a CLD between a pair of channels is quantized by using two or more angle intervals as quantization step sizes according to the locations of the pair of channels, instead of being linearly quantized to a pre-determined CLD value. Therefore, it is possible to enable an efficient and suitable CLD quantization for use in psychoacoustic models.

The method of encoding spatial parameters of a multi-channel audio signal according to the present embodiment can be applied to spatial parameters other than a CLD, such as ICC and a CPC.

A method of encoding spatial parameters of a multi-channel audio signal according to another embodiment of the present invention will hereinafter be described in detail with reference to FIG. 16. According to the embodiment illustrated in FIG. 16, two or more quantization tables having different quantization resolutions may be used to quantize spatial parameters.

Figure 16:
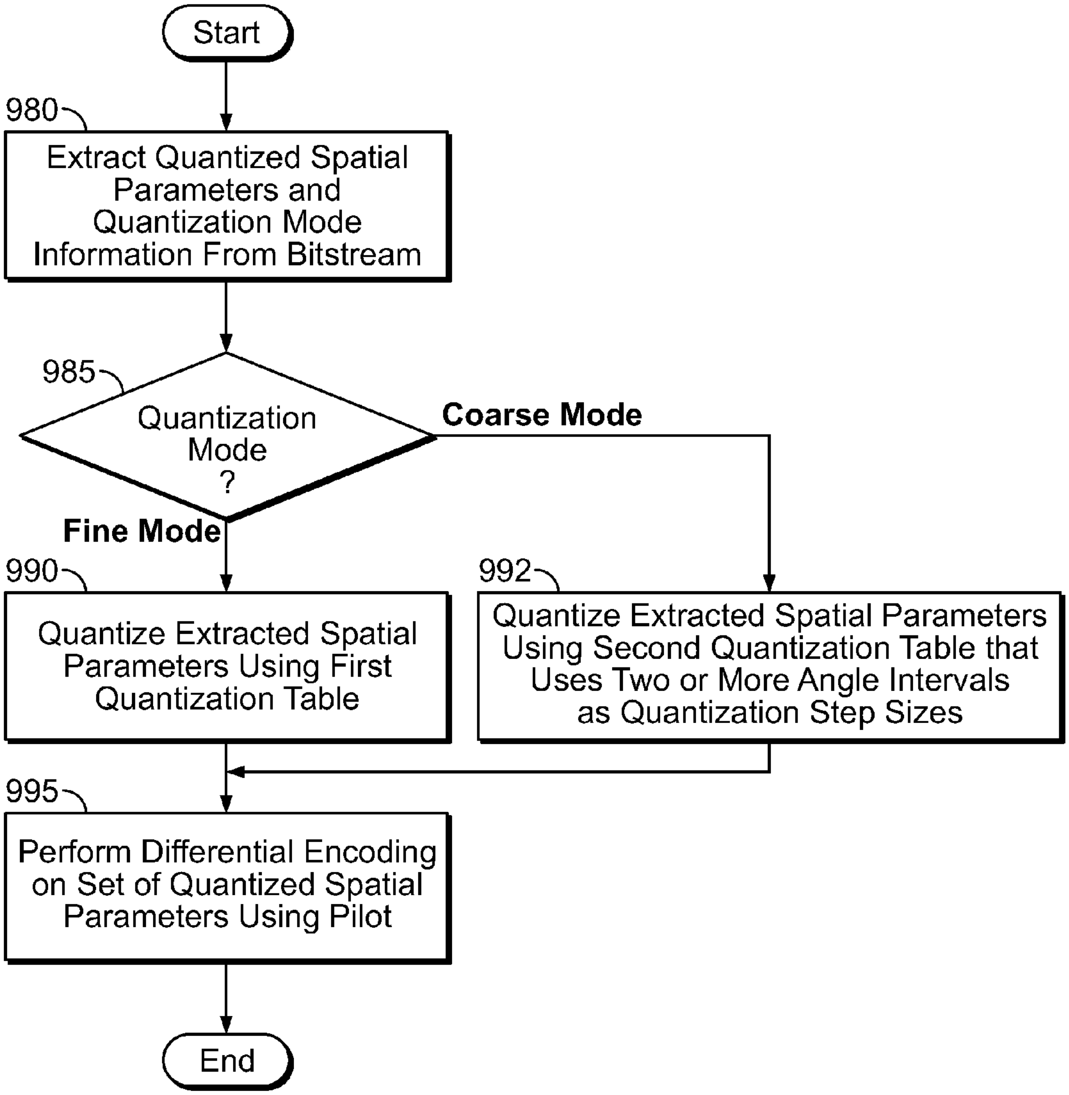
FIG. 16 is a flowchart illustrating a method of encoding spatial parameters of a multi-channel audio signal according to another embodiment of the present invention.

Referring to FIG. 16, in operation 980, spatial parameters are extracted from an audio signal to be encoded which is one of a plurality of audio signals that are obtained by dividing a multi-channel audio signal and respectively correspond to a plurality of sub-bands. Examples of the extracted spatial parameters include a CLD, CTD, ICC, and CPC.

In operation 985, the quantization unit 320 determines one of a fine mode having a full quantization resolution and a coarse mode having a lower quantization resolution than the fine mode as a quantization mode for the audio signal to be encoded. The fine mode corresponds to a greater quantization step quantity and a smaller quantization step size than the coarse mode.

The quantization unit 320 may determine one of the fine mode and the coarse mode as the quantization mode according to the energy level of the audio signal to be encoded. According to psychoacoustic models, it is more efficient to sophisticatedly quantize an audio signal with a high energy level than to sophisticatedly quantize an audio signal with a low energy level. Thus, the quantization unit 320 may quantize the multi-channel audio signal in the fine mode if the energy level of the audio signal to be encoded is higher than a predefined reference value, and quantize the audio signal to be encoded in the coarse mode otherwise.

For example, the quantization unit 320 may compare the energy level of a signal handled by an R-OTT module with the energy level of the audio signal to be encoded. Then, if the energy level of the signal handled by an R-OTT module is lower than the energy level of the audio signal to be encoded, then the quantization unit 320 may perform quantization in the coarse mode. On the other hand, if the energy level of the signal handled by the R-OTT module is higher than the energy level of the audio signal to be encoded, then the quantization unit 320 may perform quantization in the fine mode.

If the R-OTT module has a 5-1-5-1 configuration, the quantization unit 320 may compare the energy levels of audio signals respectively input via left and right channels with the energy level of the audio signal to be encoded in order to determine a CLD quantization mode for an audio signal input to R-OTT3.

In operation 990, if the fine mode is determined in operation 985 as the quantization mode for the audio signal to be encoded, then the quantization unit 320 quantizes a CLD using a first quantization table having a full quantization resolution. The first quantization table comprises 31 quantization steps. In the fine mode, the same quantization step table may be applied to each pair of channels.

In operation 992, if the coarse mode is determined in operation 985 as the quantization mode for the audio signal to be encoded, then the quantization unit 320 quantizes a CLD using a second quantization table having a lower quantization resolution than the first quantization table. The second quantization table may have two or more angle intervals as quantization step sizes. The creation of the second quantization table and the quantization of a CLD using the second quantization table may be the same as described above with reference to FIGS. 9 and 10.

In operation 995, the differential encoding unit 330 performs differential encoding, using a pilot, on a set of quantized CLDs obtained by the quantization unit 320. The operation of the differential encoding unit 330 has already been described above with reference to FIGS. 3 through 4B, and thus, a detailed description thereof will be skipped.

According to the present embodiment, if an apparatus (hereinafter referred to as the decoding apparatus) for decoding spatial parameters of a multi-channel audio signal does not have a quantization table that is used by the quantization unit 320 to perform CLD quantization, then the bitstream generation unit 340 may insert information regarding the quantization table into a bitstream and transmit the bitstream to the decoding apparatus, and this will hereinafter be described in further detail.

According to an embodiment of the present invention, information regarding a quantization table used in the encoding apparatus illustrated in FIG. 4 may be transmitted to the decoding apparatus by inserting into a bitstream all the values present in the quantization table, including indexes and CLD values respectively corresponding to the indexes, and transmitting the bitstream to the decoding apparatus.

According to another embodiment of the present invention, the information regarding the quantization table used in the encoding apparatus may be transmitted to the decoding apparatus by transmitting information that is needed by the decoding apparatus to restore the quantization table used by the encoding apparatus. For example, minimum and maximum angles, a quantization step quantity, and two or more angle intervals of the quantization table used in the encoding apparatus may be inserted into a bitstream, and then, the bitstream may be transmitted to the decoding apparatus. Then, the decoding apparatus can restore the quantization table used by the encoding apparatus based on the information transmitted by the encoding apparatus and Equations (7) and (8).

Figure 11:
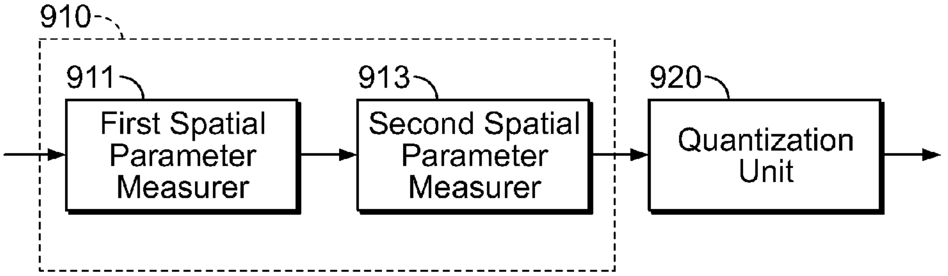
FIG. 11 is a block diagram of a spatial parameter extraction unit illustrated in FIG. 3, according to an embodiment of the present invention.

FIG. 11 is a block diagram of an example of the spatial parameter extraction unit 402 illustrated in FIG. 4, i.e., a spatial parameter extraction unit 910. Referring to FIG. 11, the spatial parameter extraction unit 910 includes a first spatial parameter measurement unit 911 and a second spatial parameter measurement unit 913.

The first spatial parameter measurer 911 measures a CLD between a plurality of channels based on an input multi-channel audio signal. The second spatial parameter measurer unit 913 divides the space between a pair of channels of the plurality of channels into a number of sections using a predetermined angle interval or two or more angle intervals, and creates a quantization table suitable for the combination of the pair of channels. Then, a quantization unit 920 quantizes a CLD extracted by the spatial parameter extraction unit 910 using the quantization table.

Figure 12:
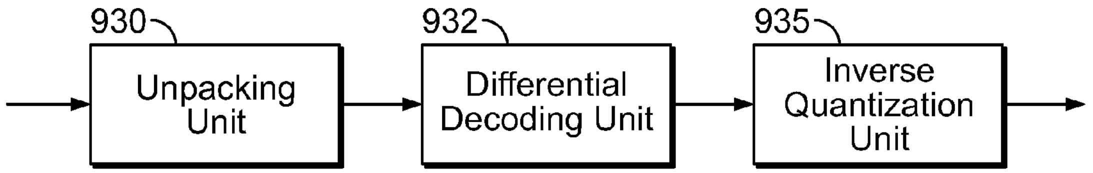
FIG. 12 is a block diagram of an apparatus for decoding spatial parameters of a multi-channel audio signal according to an embodiment of the present invention.

FIG. 12 is a block diagram of an apparatus (hereinafter referred to as the decoding apparatus) for decoding spatial parameters of a multi-channel audio signal according to an embodiment of the present invention. Referring to FIG. 12, the decoding apparatus includes an unpacking unit 930, a differential decoding unit 932, and an inverse quantization unit 935.

The unpacking unit 930 extracts a quantized CLD, which corresponds to the difference between the energy levels of a pair of channels, from an input bitstream. The inverse quantization unit 935 inversely quantizes the quantized CLD using a quantization table in consideration of the properties of the pair of channels.

A method of decoding spatial parameters of a multi-channel audio signal according to an embodiment of the present invention will hereinafter be described in detail with reference to FIG. 17.

Figure 17:
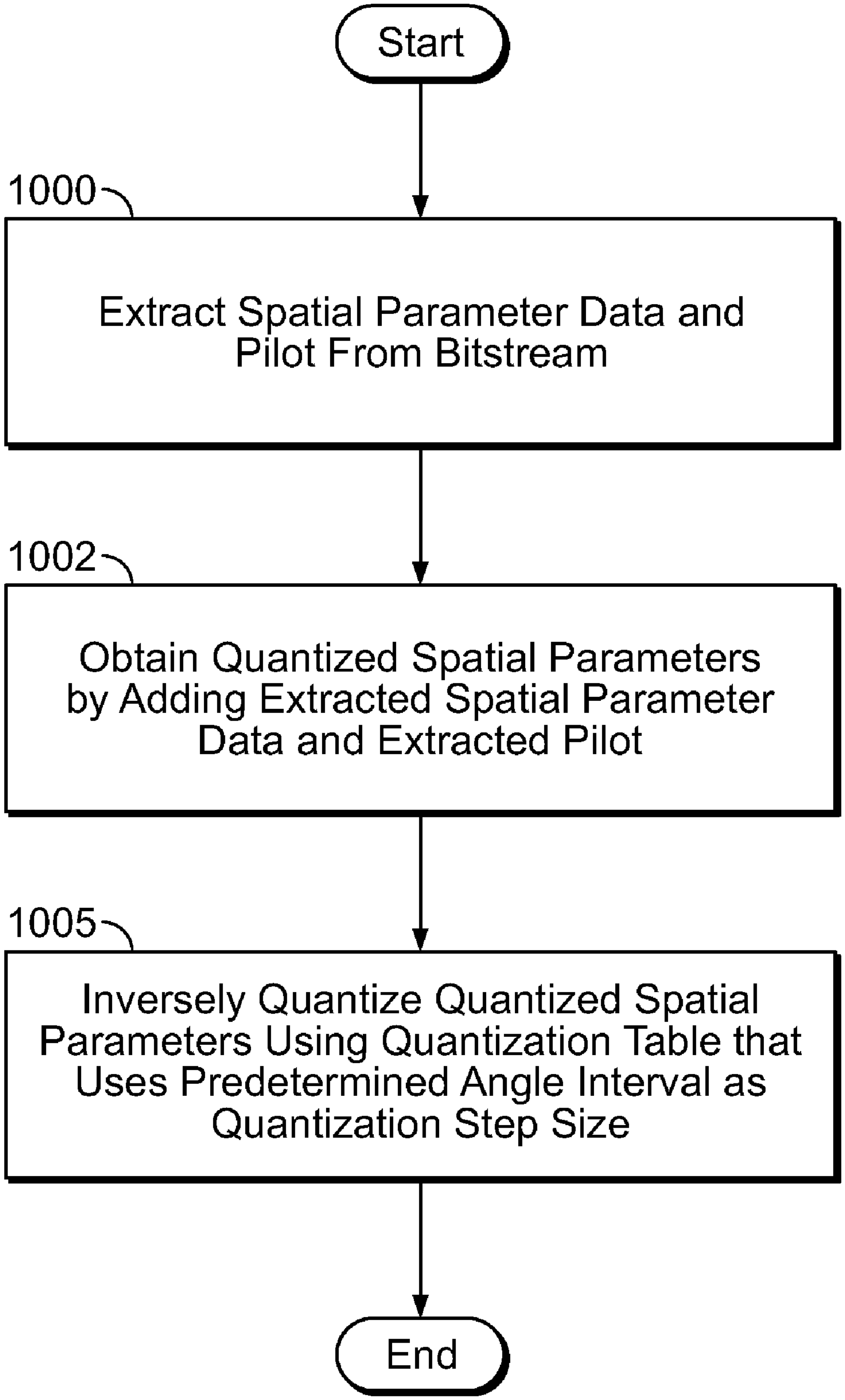
FIG. 17 is a flowchart illustrating a method of decoding spatial parameters of a multi-channel audio signal according to an embodiment of the present invention.

Referring to FIG. 17, in operation 1000, the unpacking unit 930 extracts quantized CLD data and a pilot from an input bitstream. If the extracted quantized CLD data or the extracted pilot is Huffman-encoded, then the decoding apparatus illustrated in FIG. 12 may also include a Huffman decoding unit which performs Huffman decoding on the extracted quantized CLD data or the extracted pilot. On the other hand, if the extracted quantized CLD data or the extracted pilot is entropy-encoded, the decoding apparatus may perform entropy decoding on the extracted quantized CLD data or the extracted pilot.

In operation 1002, the differential decoding unit 932 adds the extracted pilot to the extracted quantized CLD data, thereby restoring a plurality of quantized CLDs. The operation of the differential decoding unit 932 has already been described above with reference to FIGS. 2 through 4B, and thus, a detailed description thereof will be skipped.

In operation 1005, the inverse quantization unit 935 inversely quantizes each of the quantized CLDs obtained in operation 1002 using a quantization table using a predetermined angle interval as a quantization step size.

The quantization table used in operation 1005 is the same as the same as a quantization table used by an encoding apparatus during the operations described above with reference to FIGS. 7 and 8, and thus a detailed description thereof will be skipped.

According to the present embodiment, if the inverse quantization unit 930 does not have any information regarding the quantization table, then the inverse quantization unit 930 may extract information regarding the quantization table from the input bitstream, and restore the quantization table based on the extracted information.

According to an embodiment of the present invention, all values present in the quantization table, including indexes and CLD values respectively corresponding to the indexes, may be inserted into a bitstream.

According to another embodiment of the present invention, minimum and maximum angles and a quantization step quantity of the quantization table may be included in a bitstream.

Figure 18:
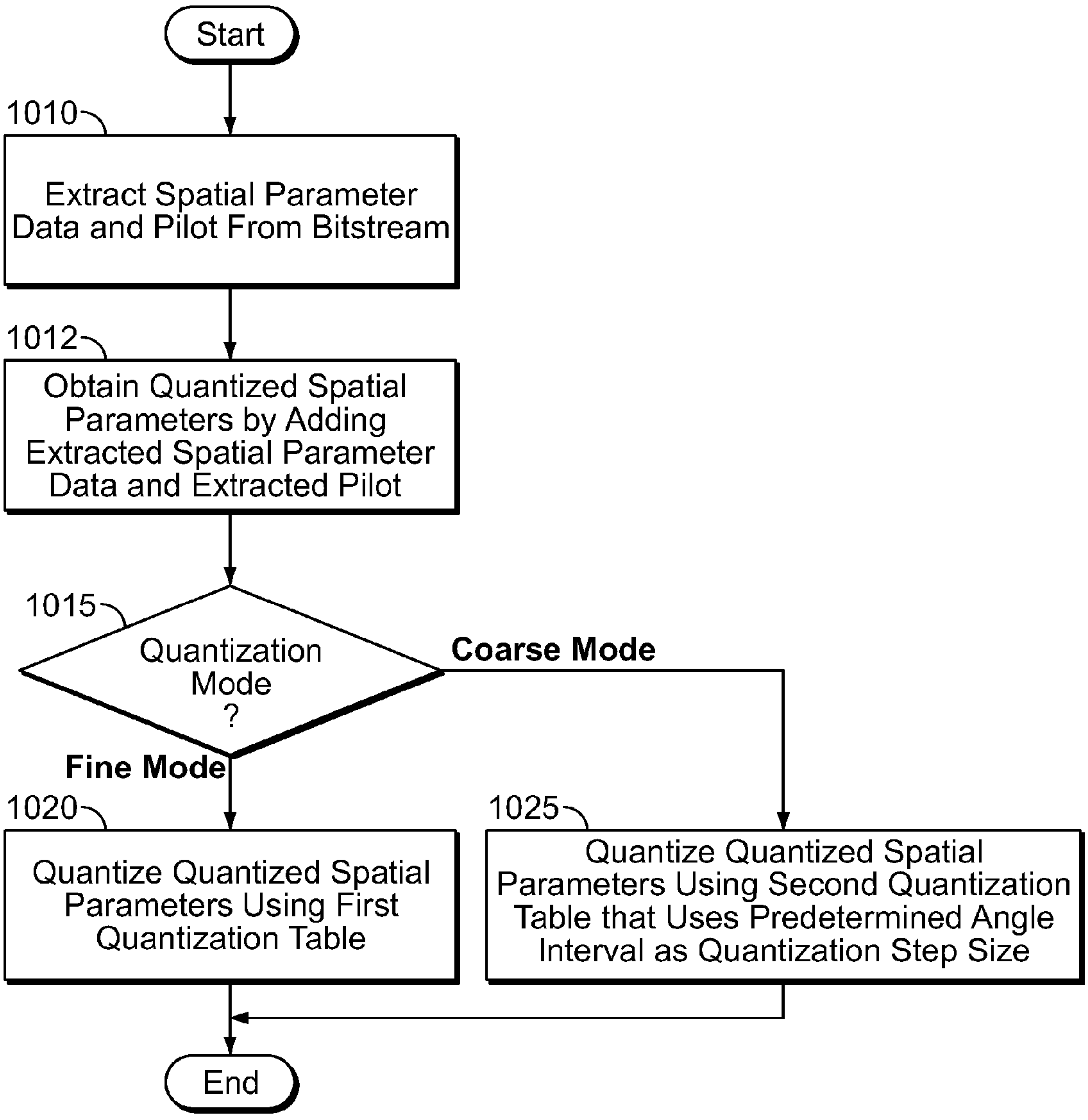
FIG. 18 is a flowchart illustrating a method of decoding spatial parameters of a multi-channel audio signal according to another embodiment of the present invention.

FIG. 18 is a flowchart illustrating a method of decoding spatial parameters of a multi-channel audio signal according to another embodiment of the present invention. According to the embodiment illustrated in FIG. 18, spatial parameters can be inversely quantized using two or more quantization tables having different quantization resolutions.

Referring to FIG. 18, in operation 1010, the unpacking unit 930 extracts quantized CLD data and a pilot from an input bitstream. If the extracted quantized CLD data or the extracted pilot is Huffman-encoded, then the decoding apparatus illustrated in FIG. 12 may also include a Huffman decoding unit which performs Huffman decoding on the extracted quantized CLD data or the extracted pilot. On the other hand, if the extracted quantized CLD data or the extracted pilot is entropy-encoded, the decoding apparatus may perform entropy decoding on the extracted quantized CLD data or the extracted pilot.

In operation 1002, the differential decoding unit 932 adds the extracted pilot to the extracted quantized CLD data, thereby restoring a plurality of quantized CLDs. The operation of the differential decoding unit 932 has already been described above with reference to FIGS. 2 through 4B, and thus, a detailed description thereof will be skipped.

In operation 1015, the inverse quantization unit 935 determines based on the extracted quantization mode information whether a quantization mode used by an encoding apparatus to produce the quantized CLDs is a fine mode having a full quantization resolution or a coarse mode having a lower quantization resolution than the fine mode. The fine mode corresponds to a greater quantization step quantity and a smaller quantization step size than the coarse mode.

In operation 1020, if the quantization mode used to produce the quantized CLDs is determined in operation 1015 to be the fine mode, then the inverse quantization unit 935 inversely quantizes the quantized CLDs using a first quantization table having a full quantization resolution. The first quantization table comprises 31 quantization steps, and quantizes a CLD between a pair of channels by dividing the space between the pair of channels into 31 sections. In the fine mode, the same quantization step quantity may be applied to each pair of channels.

In operation 1025, if the quantization mode used to produce the quantized CLDs is determined in operation 1015 to be the coarse mode, then the inverse quantization unit 935 inversely quantizes the quantized CLDs using a second quantization table having a lower quantization resolution than the first quantization table. The second quantization table may have a predetermined angle interval as a quantization step size. A second quantization table using the predetermined angle interval as a quantization step size may be the same as the quantization table described above with reference to FIGS. 7 and 8.

A method of decoding spatial parameters of a multi-channel audio signal according to another embodiment of the present invention will hereinafter be described in detail with reference to FIG. 19.

Figure 19:
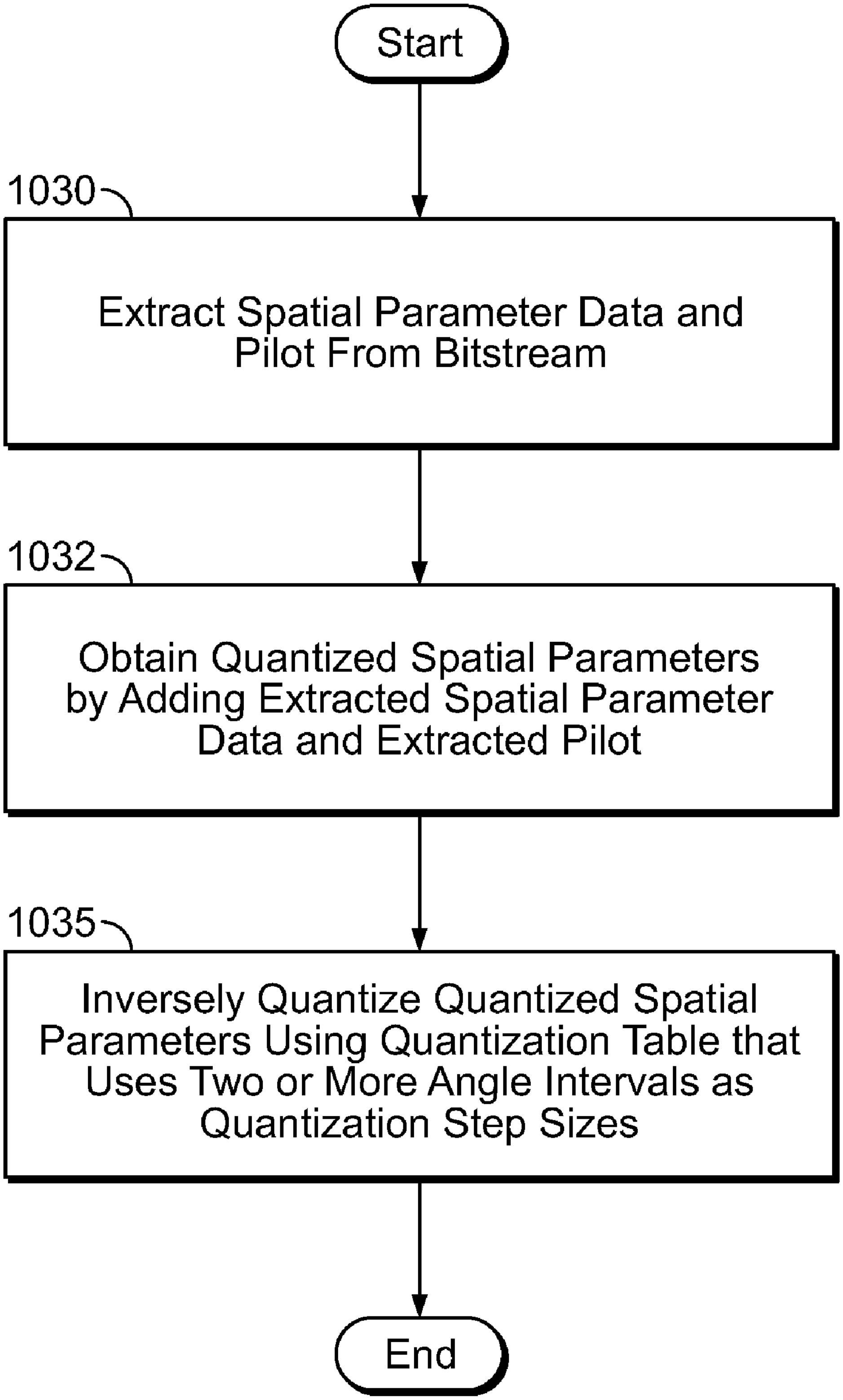
FIG. 19 is a flowchart illustrating a method of decoding spatial parameters of a multi-channel audio signal according to another embodiment of the present invention.

Referring to FIG. 19, in operation 1030, the unpacking unit 930 extracts quantized CLD data and a pilot from an input bitstream. If the extracted quantized CLD data or the extracted pilot is Huffman-encoded, then the decoding apparatus illustrated in FIG. 12 may also include a Huffman decoding unit which performs Huffman decoding on the extracted quantized CLD data or the extracted pilot. On the other hand, if the extracted quantized CLD data or the extracted pilot is entropy-encoded, the decoding apparatus may perform entropy decoding on the extracted quantized CLD data or the extracted pilot.

In operation 1032, the differential decoding unit 932 adds the extracted pilot to the extracted quantized CLD data, thereby restoring a plurality of quantized CLDs. The operation of the differential decoding unit 932 has already been described above with reference to FIGS. 2 through 4B, and thus, a detailed description thereof will be skipped.

In operation 1035, the inverse quantization unit 935 inversely quantizes each of the quantized CLDs obtained in operation 1002 using a quantization table using a pre-determined angle interval as a quantization step size.

The quantization table used in operation 1035 is the same as the quantization table used by an encoding apparatus during the operations described above with reference to FIGS. 9 and 10, and thus, a detailed description thereof will be skipped.

According to the present embodiment, if the inverse quantization unit 930 does not have any information regarding the quantization table, then the inverse quantization unit 930 may extract information regarding the quantization table from the input bitstream, and restore the quantization table based on the extracted information.

According to an embodiment of the present invention, all values present in the quantization table, including indexes and CLD values respectively corresponding to the indexes, may be inserted into a bitstream.

According to another embodiment of the present invention, minimum and maximum angles, a quantization step quantity, and two or more angle intervals of the quantization table may be included in a bitstream.

Figure 20:
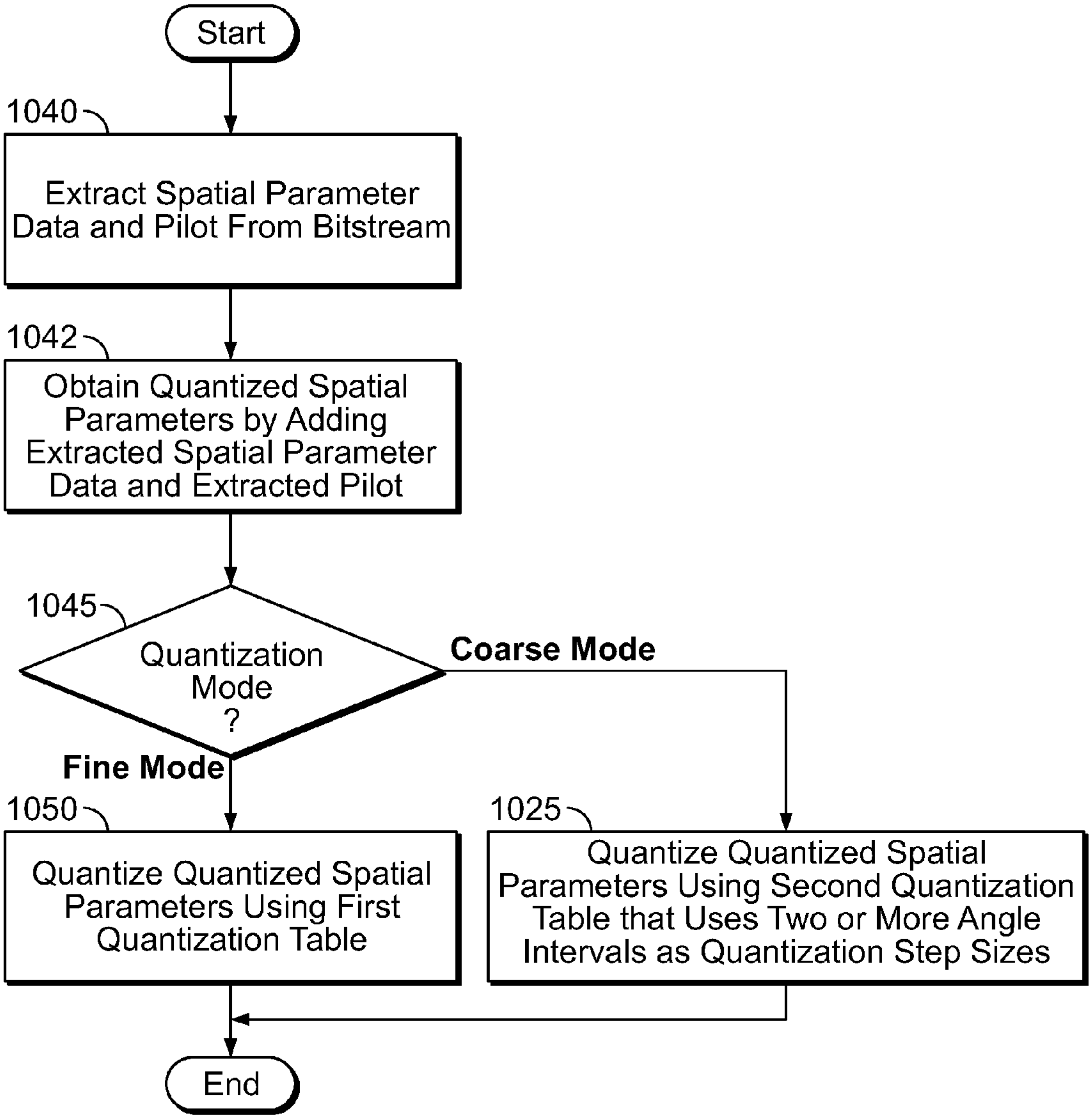
FIG. 20 is a flowchart illustrating a method of decoding spatial parameters of a multi-channel audio signal according to another embodiment of the present invention.

FIG. 20 is a flowchart illustrating a method of decoding spatial parameters of a multi-channel audio signal according to another embodiment of the present invention. According to the embodiment illustrated in FIG. 20, spatial parameters can be inversely quantized using two or more quantization tables having different quantization resolutions.

Referring to FIG. 20, in operation 1040, the unpacking unit 930 extracts quantized CLD data and a pilot from an input bitstream. If the extracted quantized CLD data or the extracted pilot is Huffman-encoded, then the decoding apparatus illustrated in FIG. 12 may also include a Huffman decoding unit which performs Huffman decoding on the extracted quantized CLD data or the extracted pilot. On the other hand, if the extracted quantized CLD data or the extracted pilot is entropy-encoded, the decoding apparatus may perform entropy decoding on the extracted quantized CLD data or the extracted pilot.

In operation 1042, the differential decoding unit 932 adds the extracted pilot to the extracted quantized CLD data, thereby restoring a plurality of quantized CLDs. The operation of the differential decoding unit 932 has already been described above with reference to FIGS. 2 through 4B, and thus, a detailed description thereof will be skipped.

In operation 1045, the inverse quantization unit 935 determines based on the extracted quantization mode information whether a quantization mode used by an encoding apparatus to produce the quantized CLDs is a fine mode having a full quantization resolution or a coarse mode having a lower quantization resolution than the fine mode. The fine mode corresponds to a greater quantization step quantity and a smaller quantization step size than the coarse mode.

In operation 1050, if the quantization mode used to produce the quantized CLDs is determined in operation 1045 to be the fine mode, then the inverse quantization unit 935 inversely quantizes the quantized CLDs using a first quantization table having a full quantization resolution. The first quantization table comprises 31 quantization steps, and quantizes a CLD between a pair of channels by dividing the space between the pair of channels into 31 sections. In the fine mode, the same quantization step quantity may be applied to each pair of channels.

In operation 1055, if the quantization mode used to produce the quantized CLDs is determined in operation 1045 to be the coarse mode, then the inverse quantization unit 935 inversely quantizes the quantized CLDs using a second quantization table having a lower quantization resolution than the first quantization table. The second quantization table may have two or more angle intervals as quantization step sizes. A second quantization table using the two or more angle intervals as quantization step sizes may be the same as the quantization table described above with reference to FIGS. 9 and 10.

The present invention can be realized as computer-readable code written on a computer-readable recording medium. The computer-readable recording medium may be any type of recording device in which data is stored in a computer-readable manner. Examples of the computer-readable recording medium include a ROM, a RAM, a CDROM, a magnetic tape, a floppy disc, an optical data storage, and a carrier wave (e.g., data transmission through the Internet). The computer-readable recording medium can be distributed over a plurality of computer systems connected to a network so that computer-readable code is written thereto and executed therefrom in a decentralized manner. Functional programs, code, and code segments needed for realizing the present invention can be easily construed by one of ordinary skill in the art.

INDUSTRIAL APPLICABILITY

As described above, according to the present invention, it is possible to enhance the efficiency of encoding/decoding by reducing the number of quantization bits required. Conventionally, a CLD between a plurality of arbitrary channels is calculated by indiscriminately dividing the space between each pair of channels that can be made up of the plurality of arbitrary channels into 31 sections, and thus, a total of 5 quantization bits are required. On the other hand, according to the present invention, the space between a pair of channels is divided into a number of sections, each section having, for example, an angle of 3° If the angle between the pair of channels is 30° the space between the pair of channels may be divided into 11 sections, and thus a total of 4 quantization bits are needed. Therefore, according to the present invention, it is possible to reduce the number of quantization bits required.

In addition, according to the present invention, it is possible to further enhance the efficiency of encoding/decoding by performing quantization with reference to actual speaker configuration information. As the number of channels increases, the amount of data increases by 31*N (where N is the number of channels). According to the present invention, as the number of channels increases, a quantization step quantity needed to quantize a CLD between each pair of channels decreases so that the total amount of data can be uniformly maintained. Therefore, the present invention can be applied not only to a 5.1 channel environment but also to an arbitrarily expanded channel environment, and can thus enable an efficient encoding/decoding.

While the present invention has been particularly shown and described with reference to exemplary embodiments thereof, it will be understood by those of ordinary skill in the art that various changes in form and details may be made therein without departing from the spirit and scope of the present invention as defined by the following claims.

The invention claimed is:

1. A method of decoding an audio signal, comprising:

receiving a bitstream of an audio signal with a plurality of channels;

obtaining a pilot reference value corresponding to information, the information being related to a quantized channel level difference between two channels among the plurality of channels;

obtaining a pilot difference value corresponding to the pilot reference value;

obtaining the information related to the quantized channel level difference by adding the pilot reference value to the pilot difference value; and inverse-quantizing the information related to the quantized channel level difference using a quantization table.

2. The method of claim 1, wherein the inverse-quantizing step comprises:

extracting a quantization mode; and inverse-quantizing the information related to the quantized channel level difference using a first quantization table when the quantization mode is a first mode, and using a second quantization table when the quantization mode is a second mode.

3. The method of claim 2, wherein a quantization resolution of the first quantization table is different from that of the second quantization table.

4. The method of claim 3, wherein the first quantization table have a number of quantization step more than the second quantization table.

5. The method of claim 3, wherein the first quantization table have a smaller quantization step size than the second quantization table.

6. The method of claim 2, wherein the quantization mode is determined based on an energy level of a signal to be quantized.

7. The method of claim 1, wherein the pilot reference value is one of a mean, median and mode of the set of quantized channel level difference.

8. The method of claim 1, further comprising:

extracting Huffman-encoded information from the bitstream, the Huffman-encoded information being related to a channel level difference between two channels; and performing Huffman decoding on the extracted Huffman-encoded information.

9. An apparatus of decoding an audio signal, comprising:

an unpacking unit receiving a bitstream of an audio signal with a plurality of channels, obtaining a pilot reference value corresponding to information, the information being related to a quantized channel level difference between two channels among the plurality of channels, and obtaining a pilot difference value corresponding to the pilot reference value;

a differential decoding unit obtaining the information related to the quantized channel level difference by adding the pilot reference value to the pilot difference value; and an inverse quantization unit inverse-quantizing the information related to the quantized channel level difference using a quantization table.

10. A computer-readable recording medium having recorded thereon a program for executing the method of claim 1.

* * * * *